US007522267B2

(12) United States Patent
Hofmeister et al.

(10) Patent No.: US 7,522,267 B2
(45) Date of Patent: Apr. 21, 2009

(54) SUBSTRATE TRANSPORT APPARATUS WITH AUTOMATED ALIGNMENT

(75) Inventors: Christopher Hofmeister, Hampstead, NH (US); Martin Hosek, Lowell, MA (US); Stuart Beale, Lowell, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 11/485,146

(22) Filed: Jul. 11, 2006

(65) Prior Publication Data
US 2007/0065144 A1 Mar. 22, 2007

Related U.S. Application Data

(60) Provisional application No. 60/698,223, filed on Jul. 11, 2005.

(51) Int. Cl.
*G03B 27/58* (2006.01)
*G03B 27/62* (2006.01)
(52) U.S. Cl. .......................................... 355/72; 355/75
(58) Field of Classification Search ................. 355/72, 355/77, 75; 414/800; 700/59; 250/311
See application file for complete search history.

(56) References Cited

U.S. PATENT DOCUMENTS

| 4,825,808 | A | 5/1989 | Takahashi et al. ............ 118/719 |
| 5,695,564 | A | 12/1997 | Imahashi ..................... 118/719 |
| 5,788,447 | A | 8/1998 | Yonemitsu et al. ........... 414/217 |
| 5,882,165 | A | 3/1999 | Maydan et al. .............. 414/217 |
| 6,198,976 | B1 | 3/2001 | Sundar et al. .................. 700/59 |
| 6,852,194 | B2 | 2/2005 | Matsushita et al. ...... 156/345.32 |
| 6,962,471 | B2 | 11/2005 | Birkner et al. ............... 414/217 |
| 7,090,741 | B2 | 8/2006 | Narushima et al. ...... 156/345.26 |
| 2004/0227924 | A1* | 11/2004 | Willems Van Dijk et al. .. 355/72 |
| 2005/0205781 | A1* | 9/2005 | Kimba ....................... 250/311 |

FOREIGN PATENT DOCUMENTS

JP 2003203965 A * 7/2003

* cited by examiner

*Primary Examiner*—Peter B Kim
(74) *Attorney, Agent, or Firm*—Perman & Green, LLP; Richard Pickreign

(57) ABSTRACT

A substrate processing apparatus is provided with a substrate transport apparatus. The transport apparatus is used for automating alignment of the processing apparatus. In one aspect, a through-beam sensor on the transport apparatus is used to level parts of the processing apparatus. In another aspect, a through-beam sensor on the transport apparatus is used to determine the locations and angular orientations of substrate stations within a plane. In another aspect, the transport apparatus teaches itself the accurate location of a substrate aligner by repeatedly placing the substrate on the aligner, recording positional data, constructing a cost function, and determining the location of the aligner by minimizing the cost function using a numerical technique.

45 Claims, 16 Drawing Sheets

SUBSTRATE TRANSPORT APPARATUS WITH AUTOMATED ALIGNMENT

CROSS-REFERENCE TO RELATED APPLICATIONS

This application claims priority to U.S. Provisional Patent Application No. 60/698,223, filed Jul. 11, 2005 which is incorporated by reference herein in its entirety.

BACKGROUND

1. Field of the Exemplary Embodiments

The exemplary embodiments disclose herein relate to substrate processing apparatus and, more particularly, to apparatus for automating alignment of a substrate processing apparatus.

2. Brief Description of Related Developments

The manufacture of semiconductors, flat panel displays, and similar articles typically involves transporting substrates between substrate locations or stations in a substrate processing apparatus. Transport apparatus governed by electronic control systems are typically used for this purpose. A processing apparatus may include various devices through which substrates are cycled during fabrication. Each device may have one or more associated substrate stations. These stations may, for example, be locations at which a transport apparatus places and removes substrates from the device. Due to the objectives of minimizing costs of fabrication facilities and maximizing substrate throughput, equipment is often tightly arranged. Therefore transport apparatus move substrates through narrow pathways to avoid obstructions. Moreover, the ever decreasing size of microstructures formed on substrates demands highly accurate placement of substrates at desired locations. Hence, the substrates are moved along trajectories that are precisely and accurately determined. Accordingly, it is desirable for a transport control system to operate using an accurate representation of system geometry. Substrate station coordinates are taught to the control system upon initial setup of the system and are re-taught following events that may alter system geometry, such as replacement of a component.

One conventional method of teaching is to maneuver the transport apparatus and visually align the apparatus with each station. This manual method introduces subjectivity into the alignment. Skilled technicians are required, and even so it is likely that no two technicians will align the system in precisely the same manner. The manual method is time consuming and causes valuable equipment to sit idle. It is therefore desirable to automate the teaching process to improve accuracy and repeatability and to reduce required down-time. It is also desirable to do so without using specialized targets or sensors that are specific to the alignment process.

SUMMARY

The present invention is directed to automated teaching and alignment. In one aspect, a substrate processing apparatus has a substrate station and a leveling device for leveling the substrate station relative to a predetermined reference frame. The leveling device comprises a frame and a drive system connected to the frame. The leveling device further comprises a movable arm connected to the drive system, having a movable through-beam sensor thereon. The leveling device further comprises a control system connected to the drive system for moving the movable arm and positioning the through-beam sensor. The leveling device further comprises a leveling system connected to the frame for changing an orientation of the substrate station relative to the predetermined reference frame. The control system of the leveling device is programmed to position the through-beam sensor, with the movable arm, to detect at least one predetermined substrate station geometric feature so that detection of the predetermined geometric feature with the through-beam sensor is capable of defining, in the control system, an inclination of the substrate station relative to the reference frame, and is programmed to generate a leveling input for adjusting the leveling system and changing the orientation of the substrate station relative to the predetermined reference frame.

In another aspect, an apparatus for determining the inclination of a substrate station relative to a reference plane comprises a drive system and a movable arm connected to the drive system and having a positionable through-beam sensor. The apparatus further comprises a control system controllably connected to the drive system for moving the movable arm and positioning the through-beam sensor at predetermined positions. The control system is adapted for positioning the through-beam sensor with the drive system to serially approach and detect at least three reference features, the reference features having a predetermined geometrical relationship to the substrate station. The control system is further adapted to record a position of the sensor when each reference feature is detected. The control system is programmed to calculate the inclination of the substrate station relative to the reference plane along at least two directions within the reference plane.

In another aspect, a substrate transport apparatus auto-teach system for teaching a substrate transport apparatus a location of a substrate station comprises a drive system associated with a transport apparatus coordinate system and a movable arm connected to the drive system and having a positionable through-beam sensor. The system further comprises a control system controllably connected to the drive system for moving the movable arm and positioning the through-beam sensor. The control system is programmed for positioning the through-beam sensor with the movable arm to approach and detect the at least one reference feature along at least two different paths of approach, the at least one reference feature having a predetermined geometric relationship to the substrate station. The control system is further programmed to record the position of the sensor when the at least one reference feature is detected on each path of approach, and to determine therefrom the location of the substrate station in the transport apparatus coordinate system.

In yet another aspect, a substrate transport apparatus auto-teach system for auto-teaching a substrate station location comprises a frame and a substrate transport apparatus movably connected to the frame and having an associated transport apparatus coordinate system. The system further comprises an aligner connected to the frame. The system further comprises a control system operably connected to the transport apparatus and programmed to position with the transport apparatus, an object on the aligner, and to measure with the aligner a spatial relationship between the object and the aligner. The control system is further programmed with spatial coordinates, within the transport apparatus coordinate system, identifying a rough location of the substrate station, and the program is arranged to combine the spatial coordinates and the measured spatial relationship to generate a final location of the substrate station.

In another aspect, a substrate transport apparatus auto-teach system for auto-teaching a location of a substrate aligner comprises a frame and a substrate transport apparatus movably connected to the frame and having an associated transport apparatus coordinate system. The system further comprises a substrate aligner connected to the frame, and a control system operably connected to the substrate transport apparatus and the substrate aligner. The control system is programmed to repeatedly position, with the transport apparatus, a substrate on the aligner at different locations, and for each location to measure with the aligner a spatial relationship between the substrate and the aligner. The control system is programmed with spatial coordinates, within the transport apparatus coordinate system, identifying a rough location of the substrate aligner, and the program is arranged to combine the spatial coordinates and the measured spatial relationships to generate a final location of the substrate aligner.

In another aspect, a method of leveling an object relative to a predetermined reference frame comprises providing, to a control system, initial coordinates, in the predetermined reference frame, of at least one feature having a predetermined geometric relationship to the object. The method further comprises approaching and detecting the at least one feature at least twice with a through-beam sensor mounted on a robotic arm, the robotic arm being controlled by the control system. The method further comprises determining, with the control system, the inclination of the object relative to the predetermined reference frame. The method further comprises generating, with the control system, a leveling input for changing the inclination of the object relative to the predetermined reference frame. The method further comprises using the leveling input to change the inclination of the object relative to the predetermined reference frame.

In yet another aspect, a method of determining the location of an object in at least two degrees of freedom relative to a predetermined reference frame comprises providing, to a control system, a computer model of the object, wherein the computer model defines initial coordinates, in the predetermined reference frame, of at least one feature having a predetermined geometric relationship to the object. The method further comprises approaching and detecting the at least one feature at least twice with a through-beam sensor mounted on a robotic arm, the robotic arm being controlled by the control system. The method further comprises determining, with the control system, the location of the object in at least two degrees of freedom relative to the predetermined reference frame.

In another aspect, a method of determining the location of a substrate aligner relative to a predetermined reference frame comprises providing a substrate transport apparatus operable for being controlled by a control system. The method further comprises providing a substrate aligner communicably connected to the control system. The method further comprises placing a substrate on the aligner at least three times, in at least three different locations, with the substrate transport apparatus, to generate positional data. The method further comprises analyzing the positional data with the control system to determine the location of the substrate aligner relative to the predetermined reference frame.

BRIEF DESCRIPTION OF THE DRAWINGS

The foregoing aspects and other features of the present invention are explained in the following description, taken in connection with the accompanying drawings, wherein.

DETAILED DESCRIPTION OF THE EXEMPLARY EMBODIMENT(S)

Figure 1:
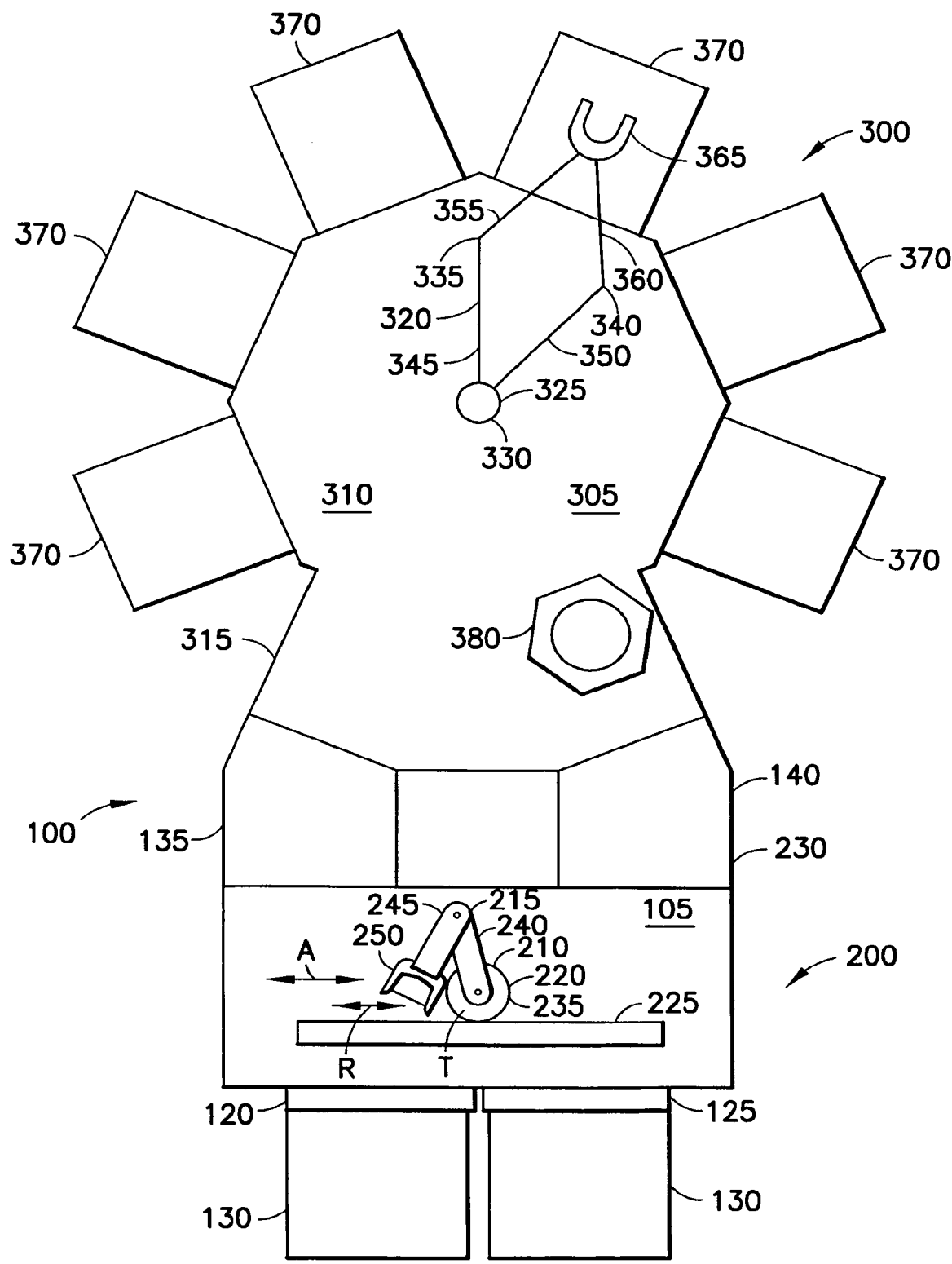
FIG. 1 is a top schematic view of a substrate processing apparatus incorporating features of an exemplary embodiment.

FIG. 1 illustrates an exemplary substrate processing apparatus 100 having an auto-teach system. The apparatus may, for convenience, be described as having a front end 200 and a back end 300. The front end generally comprises a substrate transport apparatus 210 operating within for example a controlled environment 105. Transport apparatus 210 has an arm 215 and a drive mechanism 220 that operates to move the arm. Drive mechanism 220 may be connected directly to the frame 230 of the front end 200, and may be a part of a drive system. Drive mechanism 220 may be mounted to rails 225 as shown in FIG. 1. Rails 225 are connected to the frame 230 of front end 200. Rails 225 may allow the entire transport apparatus to be translated linearly along direction A by the drive mechanism 220. In alternate embodiments, drive mechanism 220 may be mounted directly to the frame 230. Drive mechanism 220 may be part of a drive system and may be operably connected to a control system 110. Drive mechanism 220 may also be equipped with positional encoders 235 that are linked to the control system 110 and provide positional information regarding the transport apparatus 210 to the control system 110.

The configuration of substrate transport 210 shown in FIG. 1 is merely exemplary. The substrate transport 210 has an arm 215 that is connected to the drive mechanism 220. Arm 215 comprises an upper arm 240, forearm 245, and end effector 250. Upper arm 240 is connected to the drive mechanism 220 at its proximal end. The distal end of upper arm 240 is pivotally connected to the proximate end of forearm 245. End effector 250 is attached to the distal end of forearm 245.

Figure 2:
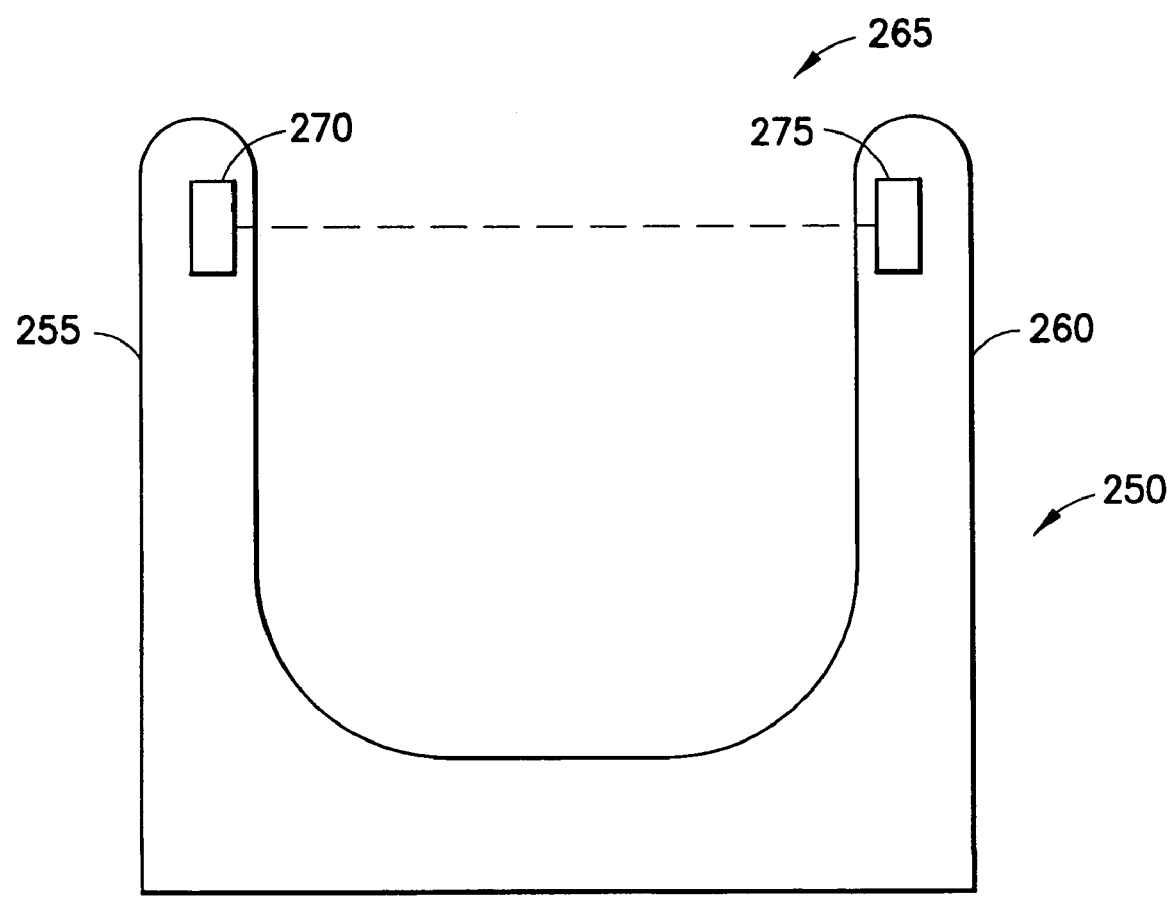
FIG. 2 is a top schematic view of an end effector of the apparatus shown in FIG. 1.

As shown in FIG. 2, in the exemplary embodiment the end effector 250 has a flat U-shaped configuration with two tines 255, 260. A through-beam sensor 265 is located on the end effector. Although the exemplary embodiments are disclosed herein with specific reference to sensors that may generally be referred to as through-beam sensors, the features of the present invention are equally applicable to any other suitable type of sensor. Through-beam sensor 265 may be comprised of an emitter 270 mounted at tine 255 and a detector 275 mounted at tine 260. Emitter 270 may be connected for example to a laser via a fiber optic cable (not shown), while detector 275 may be connected via another fiber optic cable to an optical sensor (not shown). The through-beam sensor 265 produces a beam of light between the emitter 270 and the detector 275. The sensor 265 detects blockage of the beam, such as when the beam is broken by the presence of an object. In this exemplary embodiment, the extension-retraction (otherwise referred to as R,T) movement of the arm may be in a plane that is generally horizontal (see FIG. 1). The height of this plane may be changed by translating the transport apparatus vertically (also known as Z motion) using the drive system. In this example embodiment, mechanisms in the arm 215 maintain alignment of the end effector 250 so that it always faces radially outward (for example in the direction R) from the proximate end of the upper arm 240, about which the arm rotates, regardless of the tangential position of the arm. Alternate embodiments may have independently rotatable joints connecting the upper arm to the forearm and/or connecting the end effector to the forearm, to provide additional independent motion. Other alternate embodiments may or may not be configured for vertical movement, and may have substrate transport apparatus of other configurations. Alternate embodiments may include transport apparatus having six degree of freedom arms, linear Cartesian systems, or any other suitable transport apparatus or system. Alternate embodiments may include additional substrate transport apparatus or as few as one such apparatus. Alternate embodiments may or may not have a substrate transport apparatus operating in isolated environments, such as vacuum or ultra-clean environments, and such apparatus may operate in ambient air. Other embodiments may use a through-beam sensor of any suitable type, such as an acoustic through-beam sensor. Still other embodiments may be provided with no through-beam sensor, as may be the case where a substrate aligner is used for alignment purposes, as described below.

The front end 200 of the example embodiment also includes load ports 120,125 (two are shown for example purposes). The load ports provide an interface with substrate cassettes 130. Each substrate cassette is adapted to hold several substrates, and may hold them within a sealed enclosure. The load ports 120,125 removably hold the cassettes 130 and may include mechanisms (not shown) to open cassette doors, allowing access to the substrates located in the cassettes from within the controlled environment 105 of the front end 200. Opposite the transport apparatus 210 from the load ports 120,125 are load locks 135,140. Load locks 135,140 connect the front end 200 to the back end 300. Each load lock has a valve (not shown) connecting it to the controlled environment 105 of the front end 200 and another valve connecting it to a the isolated environment 310 contained in the transport chamber 305 of the back end 300. The isolated environment 310 of the transport chamber 305 may, for example, be a vacuum, inert gas, nitrogen, or other fluid. The controlled environment 105 of the front end 200 may be clean air at atmospheric pressure, maintained with very low levels of particulate contaminants. Thus, the load locks 135,140 allow passage of substrates between the front end 200 and the back end 300 while maintaining isolation of the two environments 105,310.

In the exemplary embodiment, Back end 300 comprises a frame 315 defining a transport chamber 305. As noted above, the transport chamber 305 holds an isolated environment 310, such as a vacuum. A substrate transport apparatus 320 is located within the transport chamber 305. Transport apparatus 320 may comprise a drive mechanism 325 connected to the frame 315 and a pair of opposing arms 335,340 connected to an end effector 365. Drive mechanism 325 is connected to the control system 110 and has positional encoders 330 for indicating the arm positions to the control system 110. As shown in FIG. 1, in the exemplary embodiment the arms 335,340 of the transport apparatus form a frog leg configuration. Two upper arms 345,350 are each connected at their proximate ends to the drive mechanism 325. The distal ends of each of the two upper arms 345,350 are each connected to one of the two forearms 355,360, forming a pair of opposed elbows. The distal ends of the two forearms 355,360 are both pivotally connected to the end effector 365. End effector 365 is shown as having a flat U-shape. In this exemplary embodiment, movement of the arms 335,340 is confined within a fixed plane. In other embodiments, additional degrees of freedom may be provided, including vertical motion.

Several processing modules 370 are located on the periphery of the transport chamber 305. The processing modules 370 may operate on the substrates through various deposition, etching, or other types of processes to form electrical circuitry or other desired structure on the substrates, or to perform metrological or other functions. The processing modules 370 are connected to the chamber 305 to allow substrates to be passed from the transport chamber to the processing modules and vice versa. As described above, two load locks 135,140 are also connected to the transport chamber 305 to allow passage of substrates between the front end 200 and the transport chamber 305. In addition, a substrate aligner 380 is located between one load lock 140 and the back end transport apparatus 320. A similar arrangement is described in U.S. Pat. No. 5,882,413, which is incorporated by reference in its entirety.

Figure 3:
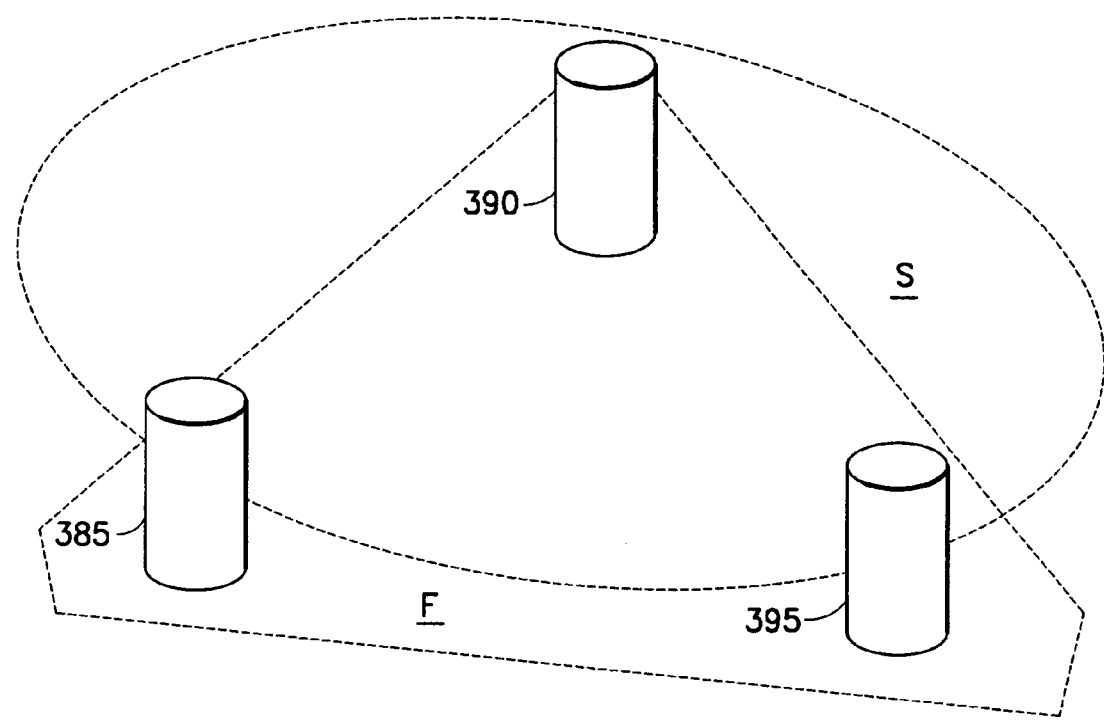
FIG. 3 is a schematic perspective view of the substrate support pins of the apparatus shown in FIG. 1.

FIG. 3 shows an arrangement of three substrate support pins 385,390,395. These pins may be located in a load lock, processing module, or other device. The pins may be used for example as rests or seats to support a substrate S, shown in dashed lines. In alternate embodiments the pins may have any desired shape. As illustrated in FIG. 3, in the exemplary embodiment one end of each pin may be connected to a surface F. In one exemplary embodiment, each substrate support pin may have a cylindrical shape, with one end of the pin connected to the surface F. In one exemplary embodiment, surface F may be an integral part of a frame of a load lock, processing module, or any other suitable seating surface of the processing apparatus. In another exemplary embodiment, surface F may be a surface of a fixture that is adapted to seat on any suitable part of the substrate processing apparatus in a predefined manner. The fixture may be a removable fixture that may be used for alignment and/or leveling purposes and may then be removed from the substrate processing apparatus. The fixture F may define a fixed relationship between the pins 385, 390, 395 and a seating surface adapted to accept the fixture, when the fixture is located on the seating surface. In the exemplary embodiments, the ends of the pins 385,390, 395 opposing the surface F may be used to support a substrate while located in a load lock processing module, or any other suitable device. The substrate support pins 385,390,395 may be used to reference a substrate station. The substrate station may, for example, be the location at which the substrate rests on the pins, the location of the substrate when it is aligned over the pins in a substrate transport plane, or some other location. The substrate support pins 385,390,395 may also serve as reference features for leveling of the load lock 135, a processing module 370, or any other device to which they may be attached.

Figure 4:
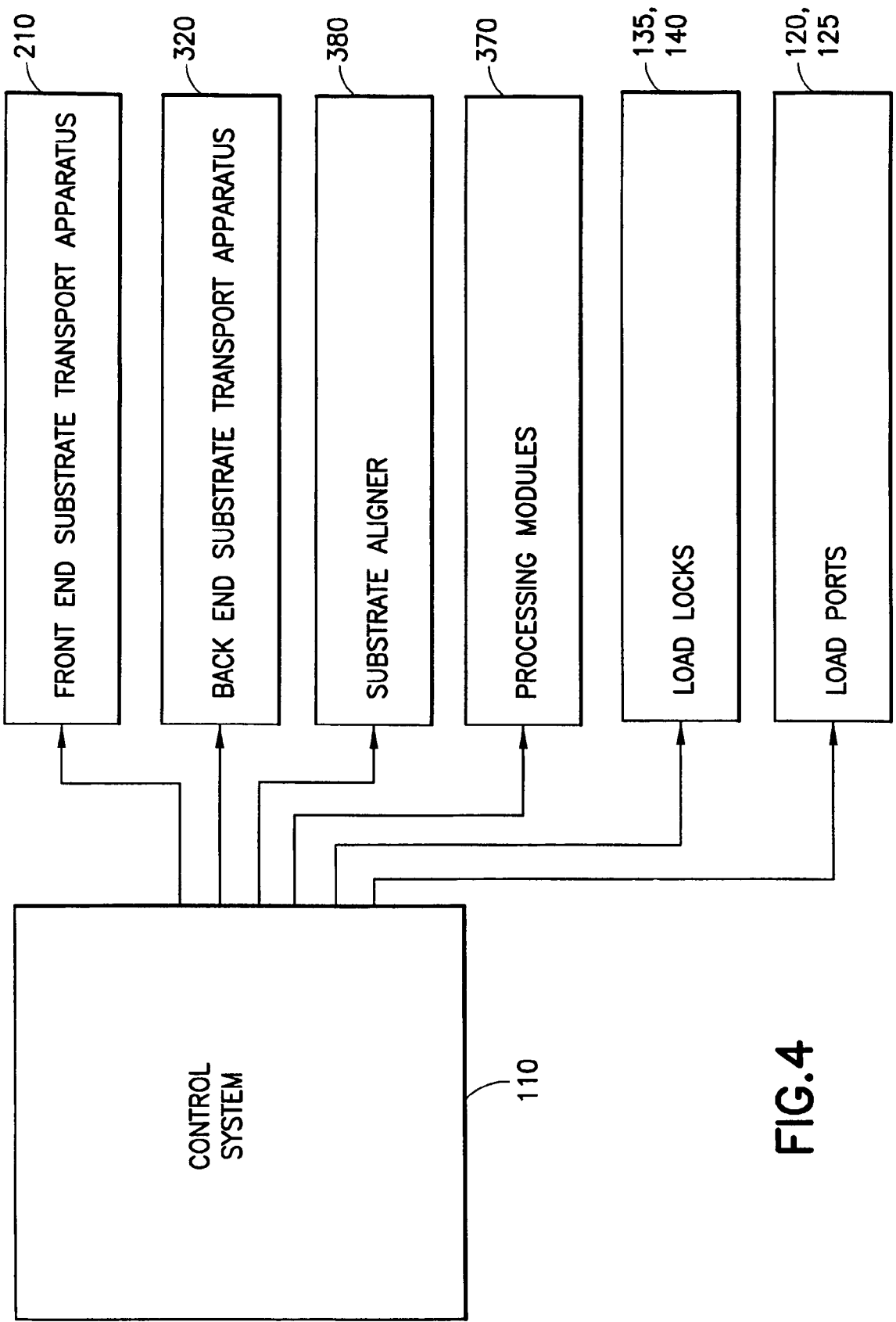
FIG. 4 is a block diagram of the control system of the apparatus in FIG. 1.

FIG. 4 is a block diagram showing connections between the control system 110 and various parts of the processing apparatus. Control system 110 is shown connected to front end substrate transport apparatus 210, back end substrate transport apparatus 320, substrate aligner 380, processing modules 370, load locks 135,140, and load ports 120,125. The control system 110 may also be connected to other devices. The control system 110 may be any suitable type of control system. For example, the control system 110 may be a single computer, computer network, or a system having a distributed control architecture. Control system 110 may be a hierarchy of computers including at least one central computer and at least one computer at each of the transport apparatus 210,320, load locks 135,140, load ports 120,125, processing modules 370, and the aligner 380.

Referring again to FIG. 1, an exemplary operation of the substrate processing apparatus 100 is now described. A removable cassette 130 may be docked at load port 120 and another cassette 130 docked at load port 125. The cassettes 130 may be open to allow access by the front end substrate transport apparatus 215. Transport apparatus 210 may approach a cassette 130 with the end effector 250. Through-beam sensor 265 may be used to map the contents of the cassette 130 by moving the end effector in a vertical direction such that any substrates within the cassette will pass between the two tines 255,260 and be detected by the through-beam sensor. Detection may occur when the light beam is broken, without any contact between the substrate and the end effector. The through beam sensor 265 may thus provide information to the control system 110 regarding the locations of substrates within the cassette. The mapping operation may be repeated on the other open substrate cassette 130. Front end substrate transport apparatus 210 may then pick a substrate from the either cassette 130 and place it into one of load locks 135,140.

The back end transport apparatus 320 may remove the substrate from the load lock 135,140 and place it on the substrate aligner 380. The substrate aligner 380 may determine the location and angular orientation of the substrate by scanning the edge of the substrate. This may be done by spinning the substrate on a chuck (not shown) while detecting the edge of the substrate with a linear CCD sensor or other device as it spins past. In alternate embodiments, the substrate may remain stationary during scanning and its edge may be detected using a different type sensor. The substrate aligner 380 determines the eccentricity of the substrate in a coordinate system that is associated with the aligner. Eccentricity is the offset of the substrate's center from a reference point. For example, the reference point may be on the axis of rotation of the chuck, with eccentricity expressed, for example, in polar or Cartesian components. The substrate eccentricity may be communicated by the aligner 380 to the control system 110.

Back end transport apparatus 320 may pick the substrate using its end effector 365. If desired, the substrate may be picked with an offset to compensate for the eccentricity of the substrate as measured by the aligner 380. Thus, the aligner 380 may be used in conjunction with the transport apparatus 320 to accurately position a substrate. With substrate alignment completed, transport apparatus 320 may accurately place the substrate within one of the processing modules 370. It may be picked and placed to and from the various processing modules 370 as required for fabricating structures on the substrate. After the substrate has been cycled through the processing modules, it may be placed again in one of the load locks 135,140 for removal by the front end transport apparatus 210 and placement in one of the substrate cassettes 130.

For operation of the processing apparatus 100 according to the above example, the control system 110 may use an representation of the geometry of the physical system. The representation of system geometry may be tabular data indicating key coordinates, such as coordinates to position one of the transport apparatus 210, for picking and placing to a cassette, load lock, processing module, or other device. This tabular data may be maintained in a computer memory. In other embodiments, more complex modeling of the system may be employed, such as use of vector-type CAD data or three-dimensional modeling. Various coordinate systems may be used for representing various geometrical relationships. For each component of the processing apparatus, a component-level coordinate system may be defined. A global coordinate system may then be used to represent the relationships between the various component-level coordinate systems. The component-level coordinate systems may be used for expressing geometric relationships within the component, while a global coordinate system may be used for expressing the geometric relationships between components. For example, the geometry of a processing module 370 may be very accurately known. Thus, the geometric relationship between substrate support pins 385,390,395 and a predetermined location for a transport apparatus to place or pick a substrate to or from the processing module may be represented in a component-level coordinate system that is specific to that processing module. Each load lock 134,140 may also have a component-level coordinate system. Each transport apparatus 210,320 may have a coordinate system, as may the substrate aligner 380. Some of the component-level coordinate systems may be Cartesian. Others may be of a polar or other type. For example, each transport apparatus may have a component-level coordinate system wherein polar coordinates $(R,\theta,Z)$ are used, with the Z-axis coincident with the axis of rotation of the respective arm(s) 215,335,340. This may simplify representation of the position of the arm(s). Similarly, the aligner 380 may have a polar component-level coordinate system, with substrate eccentricity expressed in radial and tangential components. Generally, intra-component geometrical relationships may be known with sufficient accuracy, whereas inter-component relationships may not be. The global coordinate system may be used for representing inter-component geometry and may therefore be used to represent the geometrical relationships between the component-level coordinate systems.

Accurate modeling of system geometry allows the control system 110 to adjust substrate trajectories, to avoid colliding a substrate with an object. As will be described, the substrate transport apparatus 210, 320 may be made self-teaching to increase the accuracy of the model. Further, substrate transport apparatus 210 with its through beam sensor 265 may be used to partially or fully automate leveling of the system.

In the exemplary embodiment, the control system 110 may be capable of determining the position of the end effector 250 of the front end transport apparatus 210 using the information provided by the positional encoders 235. With this information as feedback, the control system 110 can accurately position the end effector 250 at a desired location. Through-beam sensor 265 provides an indication to the control system 110 if an object is detected in the path of the light beam. Thus the control system 110 can determine the location of the end effector 250 at which the sensor 265 detects an object, as the position of the sensor is known. However, the exact position along the light beam at which the object breaks the beam may not be precisely known.

Figure 6:
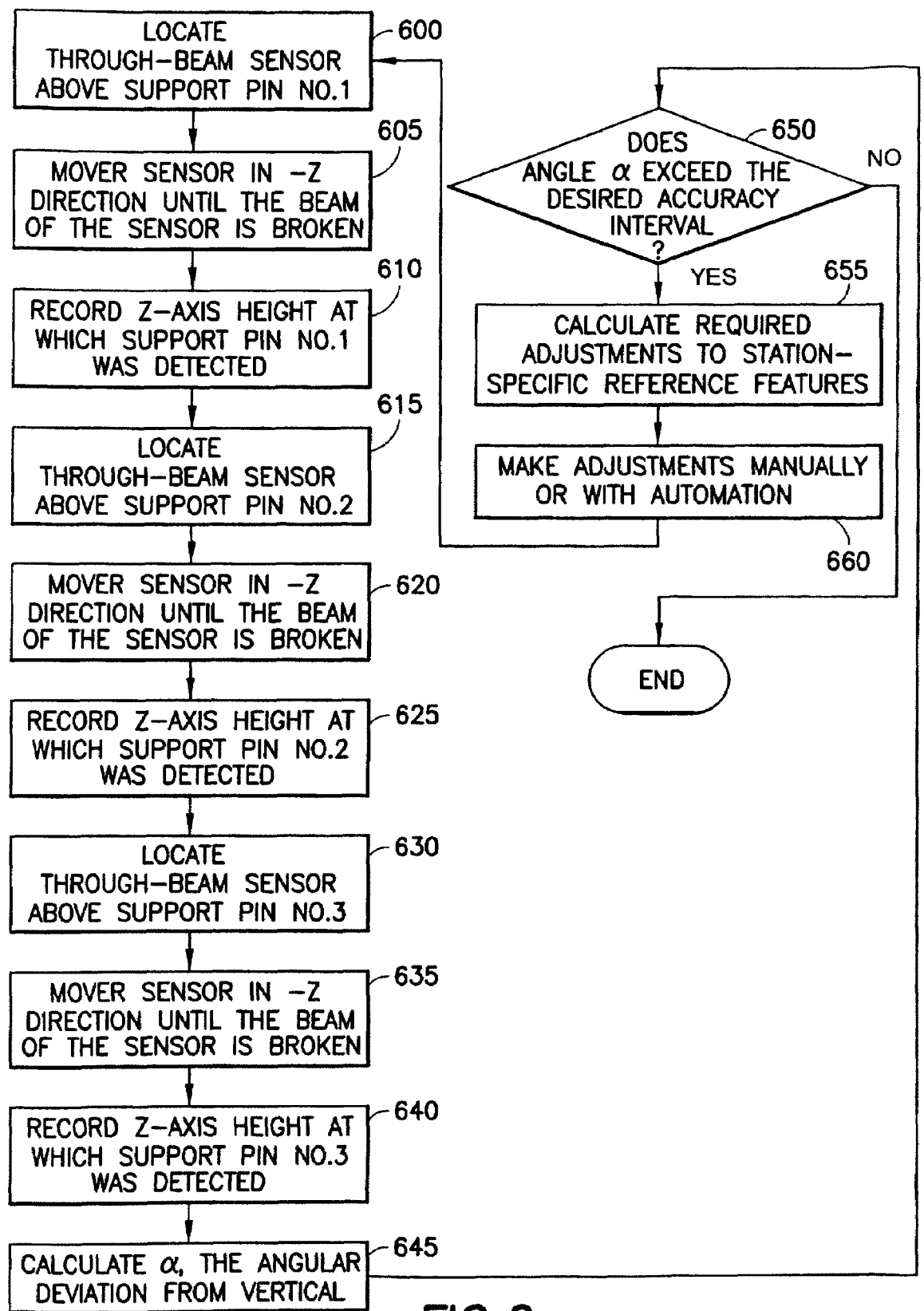
FIG. 6 is a flow chart illustrating aspects of the exemplary embodiment.

In the exemplary embodiment, the control system 110 may employ the transport apparatus for leveling components, as will be described below using leveling of load lock 135 as an example. FIG. 6 illustrates aspects of this technique in flow chart format. With respect to FIG. 6 and all other flow charts referenced herein, the sequence of blocks illustrated is merely exemplary and in alternate embodiments the blocks may be implemented in any suitable order. Further, in alternate embodiments any suitable blocks may be implemented concurrently. As shown in FIG. 3 and described above, load lock 135 has three substrate support pins 385,390,395 that may serve as reference features for leveling the load lock 135, and specifically a substrate seating surface defined in this example by the support pins inside the load lock. The geometric relationships between the substrate support pins and a predetermined location for picking and placing substrates (i.e. a substrate station) with the transport apparatus 210 may be known. However, the geometrical relationship between the transport apparatus 210 and the load lock 135 may be only roughly known. It may be desired to set the load lock level with a reference plane that is perpendicular to the z-axis of the front end transport apparatus coordinate system. In other words, the reference plane may be an R-θ plane in the transport apparatus coordinate system. Control system 110 may direct the substrate transport apparatus 210 to approach reference feature and substrate support pin 385 by locating the through-beam sensor 265 above the feature in block 600 and then moving in the −Z direction of the transport apparatus coordinate system, until the beam of the sensor is broken by the feature, in block 605. In block 610, the control system 110 may record the z-axis height at which the reference feature 385 was detected. Substrate support pins 390,395 may also be approached in a similar manner with the through beam sensor 265 in blocks 615,620 and 630,635 and their respective z-axis heights recorded in blocks 625, 640. The three z-axis heights define a plane in the substrate transport apparatus reference frame. The deviation in alignment of the load lock 135 from the reference plane, in this case an R-θ plane, may be calculated in block 645 and evaluated to determine if it falls within a desired accuracy in block 650. In this example, the load lock is level if each of the reference features has the same z-axis height. In other embodiments, the reference features 385,390, 395 may have different z-heights when a component is level. Also, in other embodiments the reference features may be approached along non-vertical directions or directions that are not parallel to one another. The reference features may be features other than substrate support pins, such as features of a leveling fixture designed to rest on a load lock, load port, processing module, or other equipment.

Figure 5:
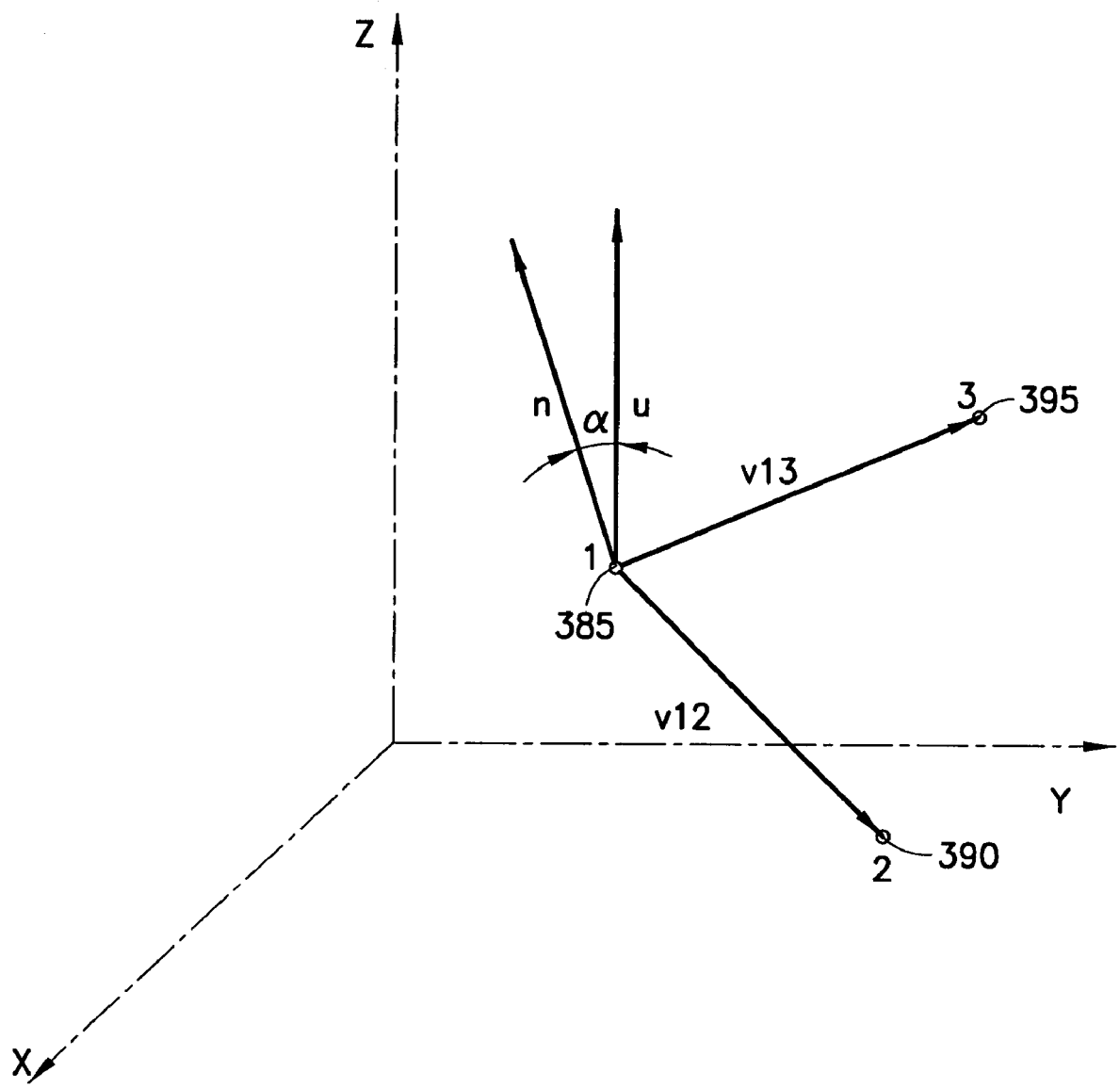
FIG. 5 is a schematic representation illustrating aspects of the exemplary embodiment.

The control system 110 may use vectors to calculate the angular deviation from vertical in block 645. FIG. 5 depicts vectors in a rectangular coordinate system wherein the z-axis may correspond to the z-axis of the substrate transport apparatus coordinate system. In other embodiments, the various vectors may be represented in any suitable coordinate system. Furthermore, while a vector-based description is used for explanatory purposes, any mathematically equivalent form of calculation may be used by the control system. $V_{12}$ is a displacement vector from the top of feature 385 to the top of feature 390. Similarly, $V_{13}$ is a displacement vector from the top of feature 385 to the top of feature 395. The z-components of these vectors in the transport apparatus coordinate system are readily determined from the indications of the through-beam sensor 265, and the x,y components may be determined using the accurate geometrical relationships of the load lock 135 that have been supplied to the control system 110 and may be described in a component-level coordinate system as discussed above. The two vectors $V_{12}$ and $V_{13}$ define a plane. A unit vector n may be constructed perpendicular to this plane by defining $n=(V_{12} \times V_{13})/|V_{12} \times V_{13}|$. A unit vector u may be defined in the z direction of the transport apparatus coordinate system. Then $\alpha = a\cos(n \cdot u)$, where $\alpha$ is the angular deviation in alignment. In block 650, $\alpha$ is compared to a maximum allowable angle. If $\alpha$ exceeds the maximum allowable angle, control system 110 may determine the required adjustments to be made to load lock 135 in terms of station-specific adjustment features, block 655. Control system 110 may optimize the required adjustments to minimize the total required adjustment for leveling the load lock 135. Alternatively, control system 110 may specify required adjustments that will achieve a desired vertical location of the substrate station in addition to leveling the load lock 135. After adjustments are made in block 660, angle $\alpha$ is again determined and compared with the allowable maximum angle. In other embodiments of the present invention, equipment to be leveled may be equipped with motorized adjustment features. The adjustment features may be connected to the control system and the leveling process fully automated.

A technique for determining the location of a substrate station within a reference plane and the angular orientation of a substrate holder within the reference plane will be demonstrated using load lock 135 as an example. In general, the through-beam sensor 265 can accurately determine the position of a reference feature only along the direction in which the feature is approached. The location and angular orientation of a substrate station may be determined by once approaching each of three reference features by moving the through-beam sensor 265 along three directions, at least two of which are independent. For example, in one aspect at least one reference feature having a predetermined geometric relationship with an object may be approached and detected at least three times with a through-beam sensor, mounted on a robotic arm, the robotic arm being controlled by a control system. The control system may determine a location of the object in at least two degrees of freedom relative to a predetermined reference frame and an angular orientation of the object, the location and angular orientation being determined from the detection of the reference features. Alternatively, by approaching a single reference feature in two independent directions, the position of the feature within the plane defined by the two directions can be determined. The angular orientation of the substrate station may then also be determined by approaching a second reference feature having a known geometrical relationship to the first feature.

Figure 7:
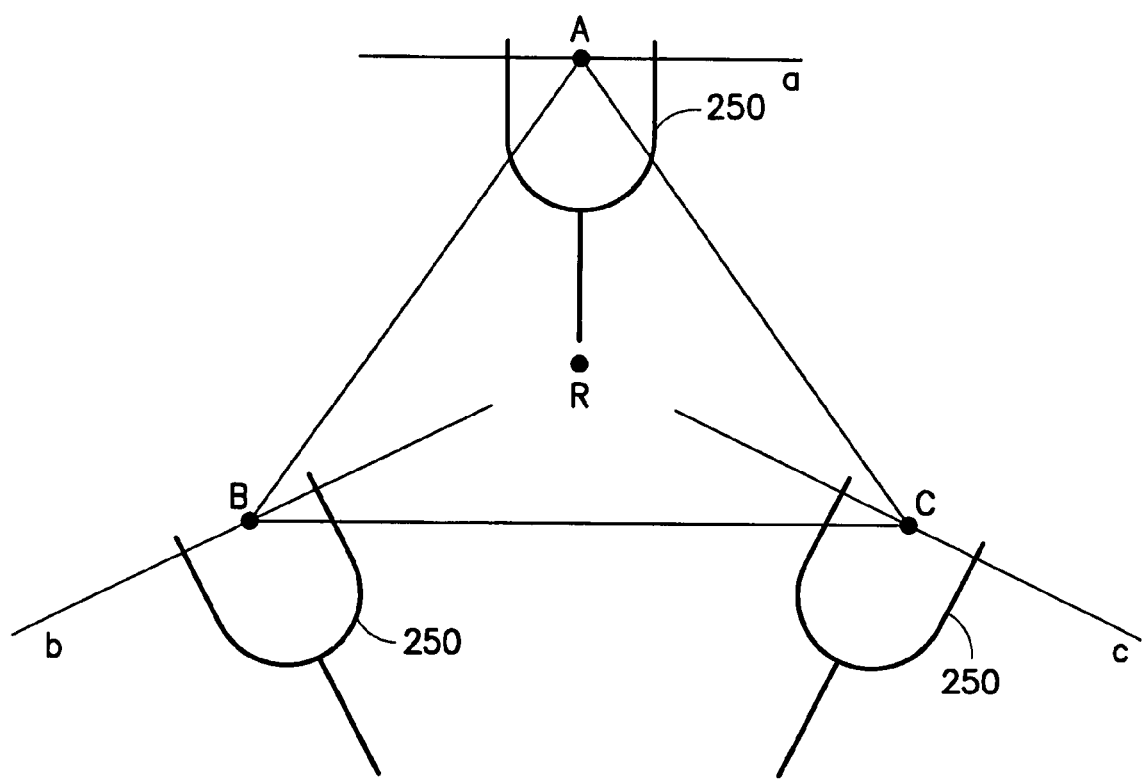
FIG. 7 is another schematic representation illustrating aspects of the exemplary embodiment.
Figure 8:
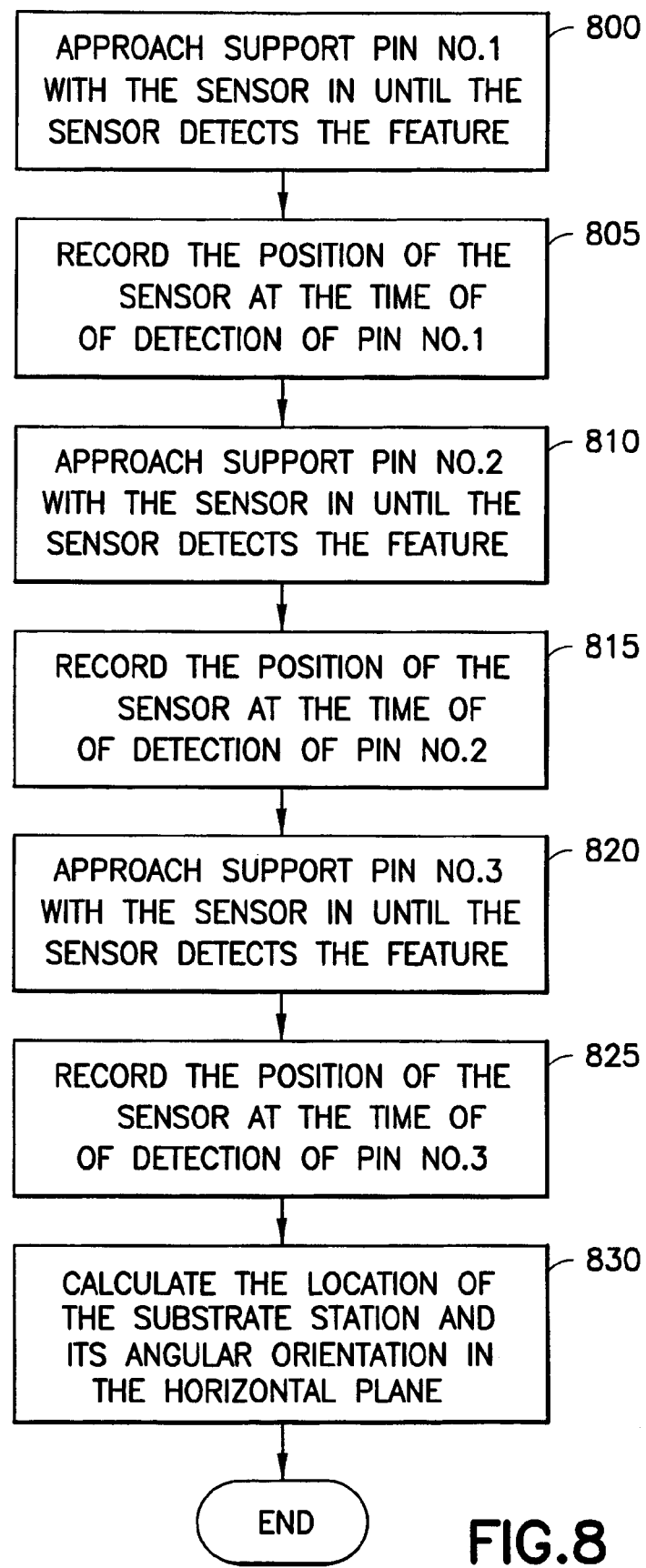
FIG. 8 is another flow chart illustrating aspects of the exemplary embodiment.

FIG. 7 geometrically depicts a technique for finding the location and orientation of a substrate station in a horizontal plane by approaching each of three reference features in a single horizontal direction. FIG. 8 illustrates the technique using a flow chart. The technique may be particularly useful when a single reference feature cannot be accessed in multiple directions due to space constrains or because the substrate transport apparatus does not possess a sufficient number of degrees of freedom. In this example, the reference features are the three substrate support pins 385,390,395 of the load lock 135. The geometric relationship between the substrate support pins 385,390,395 and a substrate station are also known. Load lock 135 may first be leveled with the substrate transport apparatus 210 as described above. In block 800, reference feature and substrate support pin 385 may then be approached with through-beam sensor 265 in a horizontal direction (a direction co-planar with an R-θ plane in the transport apparatus coordinate system) until the sensor detects the feature. The location of the sensor in the horizontal plane at which the feature is detected may then be recorded, in block 805. Support pin 390 may then also be approached in the horizontal plane in a horizontal direction until the sensor detects that feature, block 810, and the position of the sensor at the time of detection recorded, block 815. Finally, reference feature 395 may be approached in the horizontal plane with the sensor 265 until the reference feature is detected 8 in block 820 and, again, the position at which the sensor detects the feature recorded, block 825. In this example, substrate transport apparatus 210 is kept at the same position along the rails 225 during detection of each substrate support pin 385, 390,395. Thus, alternate embodiments may use the technique even though they may have a fixed drive mechanism with no rails. Because the end effector 250 of the substrate transport apparatus 210 is only operable to move in the R, θ and Z directions with the sensor always facing directly outward from the joint between the upper arm and the drive system, each of the three support pins will be approached in a direction that is at a slight angle two the other two (assuming each is at a different θ position).

Because the geometric relationships between the reference features 385,390,395 and substrate station are known to the control system 110, in block 830 the control system can determine the location of the substrate station and its angular orientation in the horizontal plane. As illustrated in FIG. 7, approaching each of the reference features 385, 390, 395 with the through-beam sensor 265 of end effector 250 may provide geometric information to the control system. For example, each reference feature 385, 390, 395 may have a surface, or portion of a surface, that intercepts the beam of the through beam sensor 265 at three corresponding points A, B, and C. The exact position of each point A, B, C need not be directly detected with sensor 265. Instead, the parameters of lines a, b, and c are determined. Each of the points A, B, C lies on the corresponding line a, b, c, and each of the lines is coincident with the beam of the through-beam sensor 265 at the instant the beam is intercepted by the corresponding reference feature. The distances among the points A, B, and C may be known. As may be seen from FIG. 7, exact coordinates of the points A, B, and C may be calculated from the known distances among the points and known locations of the lines a, b, and c along which each point is located. Point R of FIG. 7 is a reference point having a fixed position relative to the reference features 385, 390, 395. For example, point R may indicate the center point of a substrate when the substrate is placed at a substrate station. With the exact coordinates of the points A, B, and C being known, the exact coordinates of reference point R may be calculated. Thus, coordinates for a substrate station location may be determined.

Figure 9:
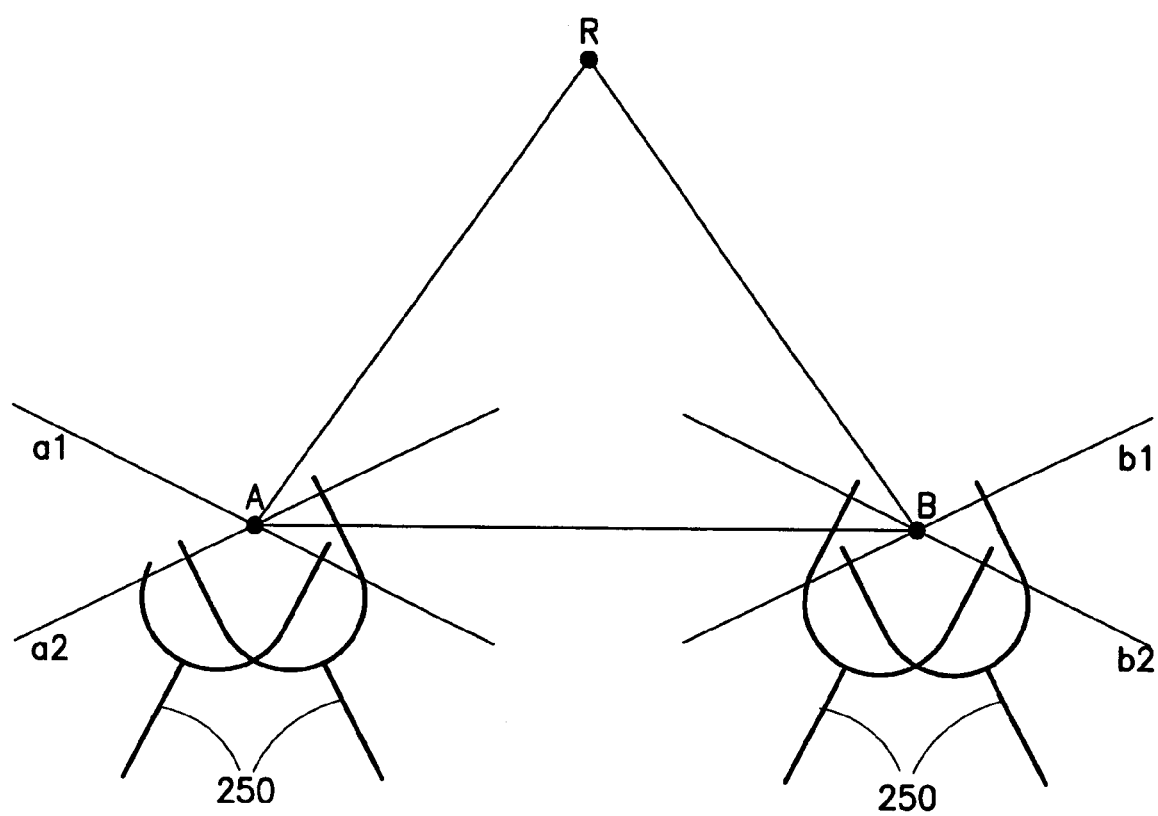
FIG. 9 is another schematic representation illustrating aspects of the exemplary embodiment.
Figure 10:
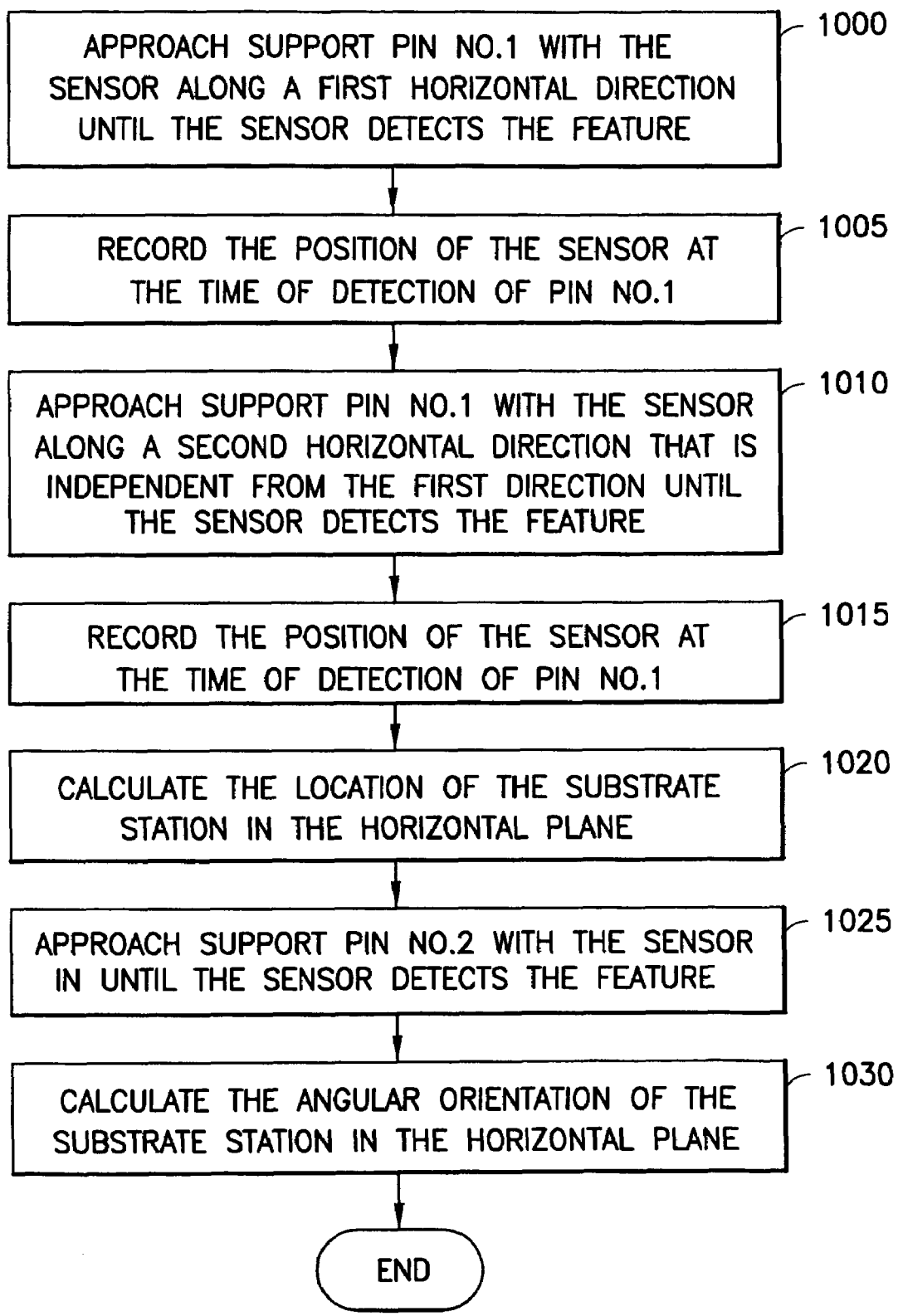
FIG. 10 is another flow chart illustrating aspects of the exemplary embodiment.

FIG. 9 geometrically depicts a different embodiment and another technique, also shown in FIG. 10, for determining the location and orientation of a substrate station in a horizontal plane. In this embodiment, an additional degree of freedom is used, as the substrate transport apparatus 210 is moved along the rails 225 to carry out the technique. Alternate embodiments may provide an additional degree of freedom in other ways, such as by providing an independently driven joint between the end effector 250 and forearm 245 for rotation of the end effector in the R-θ plane relative to the forearm. In the technique, reference feature 385 is twice approached with the through-beam sensor 265 in two independent horizontal directions, blocks 1000, 1010, and for each approach the position of the sensor at which the feature is detected is recorded, blocks 1005, 1015. From this information, the location of reference feature 385 in the horizontal plane may be determined in block 1020. FIG. 9 shows a simple case, wherein the horizontal cross-section of the reference feature may be treated as a point A, and the location is simply the intersections of the straight lines a1, a2 that coincide with the locations of the sensor beam as it is interrupted by the feature.

Reference feature 390 may then be approached with through-beam sensor 265 along a horizontal direction. The position of the sensor 256 at which feature 390 is detected provides additional information that may be used in block 1030 to determine the angular orientation of the substrate station in the horizontal plane. As shown in FIG. 9, reference feature 390 may also be twice approached with the through-beam sensor 265 in two independent horizontal directions. Reference feature 390 may be treated as a point B defined by the intersection of the two lines b1, b2 that coincide with the beam of the sensor 265 as it twice detects the reference feature 390. Approaching each of the two reference features twice generates additional data that may be used to check the accuracy of the procedure. In other embodiments the second reference feature may be approached only once, determining an angular orientation of a substrate station without the additional data. Point R of FIG. 9 is a reference point having a fixed position relative to the reference features 385, 390. With the exact coordinates of the points A, B, and C being known, the exact coordinates of reference point R may be calculated. Reference point R may indicate a substrate station location.

Figure 11:
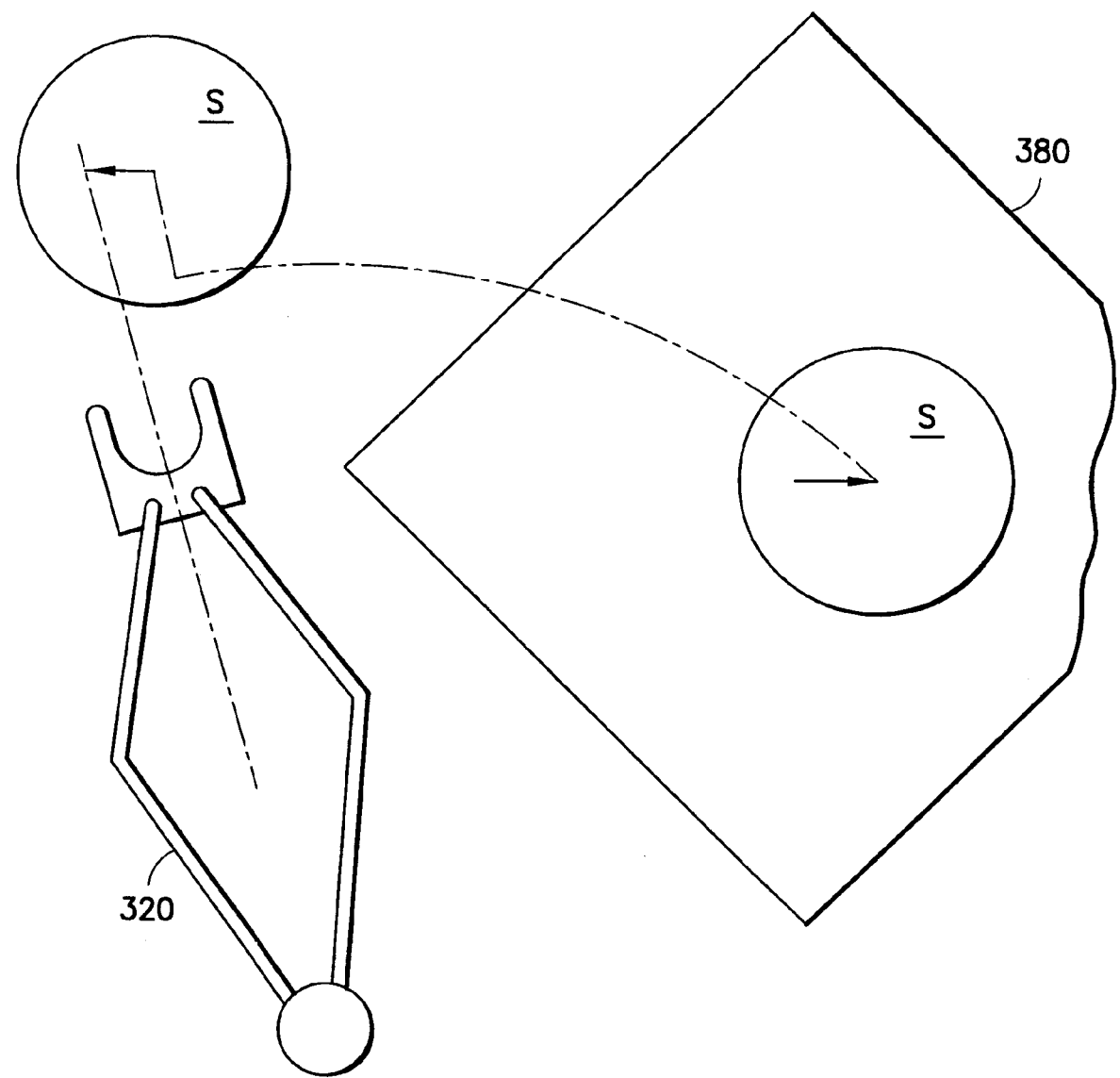
FIG. 11 is another schematic representation illustrating aspects of the exemplary embodiment.
Figure 12:
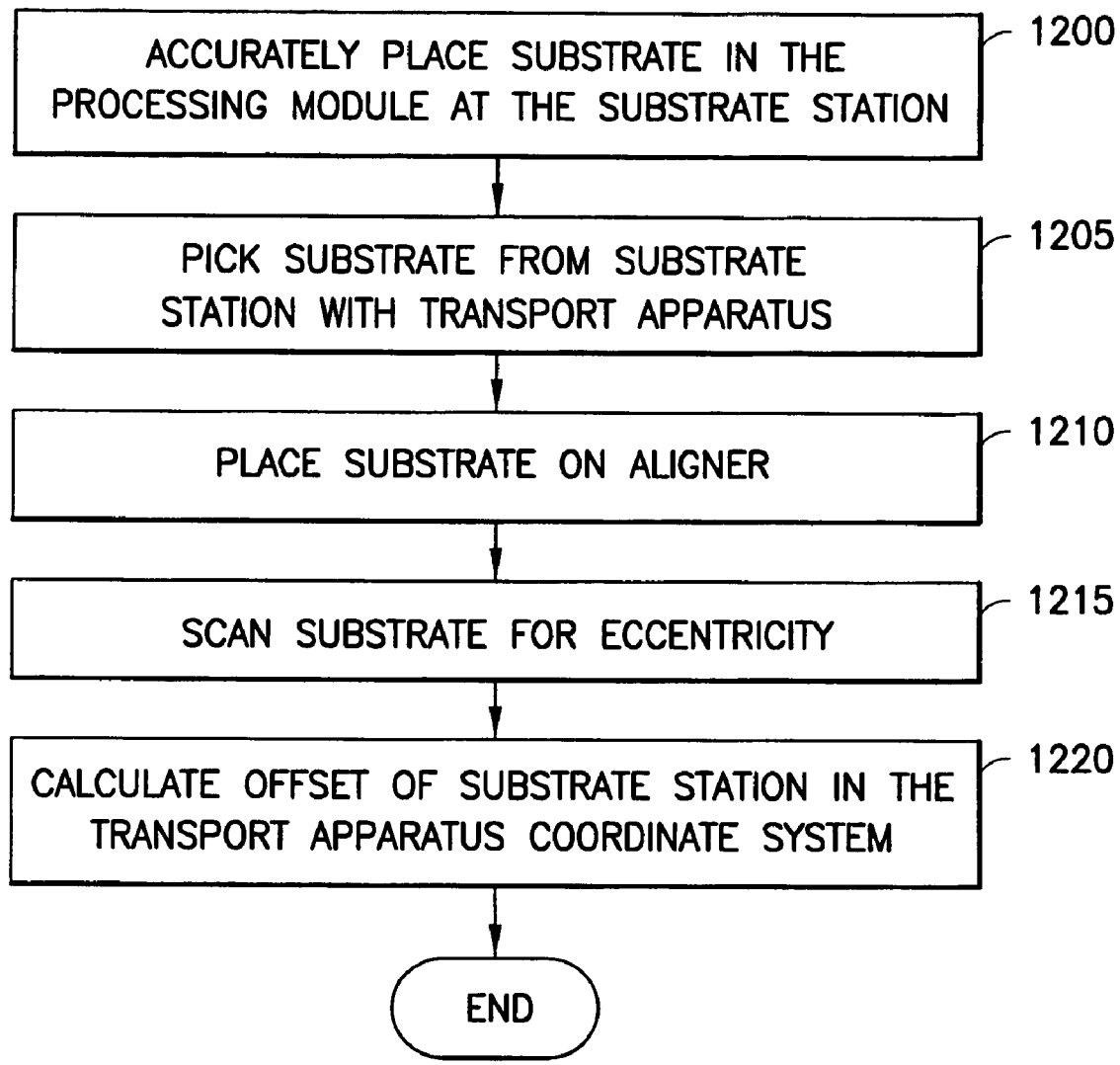
FIG. 12 is another flow chart illustrating aspects of the exemplary embodiment.

For substrate stations that will be accessed by the back end transport apparatus 320, the substrate aligner 380 may be used in combination with the transport apparatus 320 to accurately determine the locations of substrate stations. As described above, control system 110 may be provided with the accurate coordinates and angular orientation of the substrate aligner 380 in the back end transport apparatus reference frame. Alternatively, the location and coordinates of the aligner 380 may be determined through another technique that will be described below. First, the technique to determine the location of a substrate station will be described using the example of a processing module 370. FIG. 11 gives shows the technique in schematic form and FIG. 12 shows the same technique using a flow diagram. A substrate is accurately placed at the substrate station 380 in block 1200. This may be done manually. In this example, the substrate station is the position at which the substrate would ideally rest just after it is placed in the processing module 370 by the transport apparatus 320. In block 1205, the transport apparatus 320 picks up the substrate with the end effector 365. Because the exact location of the substrate station is not known, the substrate is unlikely to be exactly centered on the end effector 365 and will likely be picked with some offset. Substrate transport apparatus 320 may move the substrate and place it on the substrate aligner 380, block 1210. Because of the offset of the substrate on the end effector 365, the substrate will also be placed on the aligner 380 with an offset. In block 1215, the aligner 380 determines the location of the substrate on the aligner in an aligner coordinate system. This information is communicated to the control system 110. Because the relationship between the aligner reference system and the transport apparatus reference system is known to the control system 110, the control system may apply the appropriate coordinate transformation to calculate the offset in the transport apparatus reference system. In block 1220, the control system may determine the accurate location of the substrate station using the offset coordinates and the coordinates at which the substrate was picked. A variation of this technique is described in U.S. patent application Ser. No. 10/613,967, filed on Jul. 3, 2003, which is incorporated by reference in its entirety.

Figure 15:
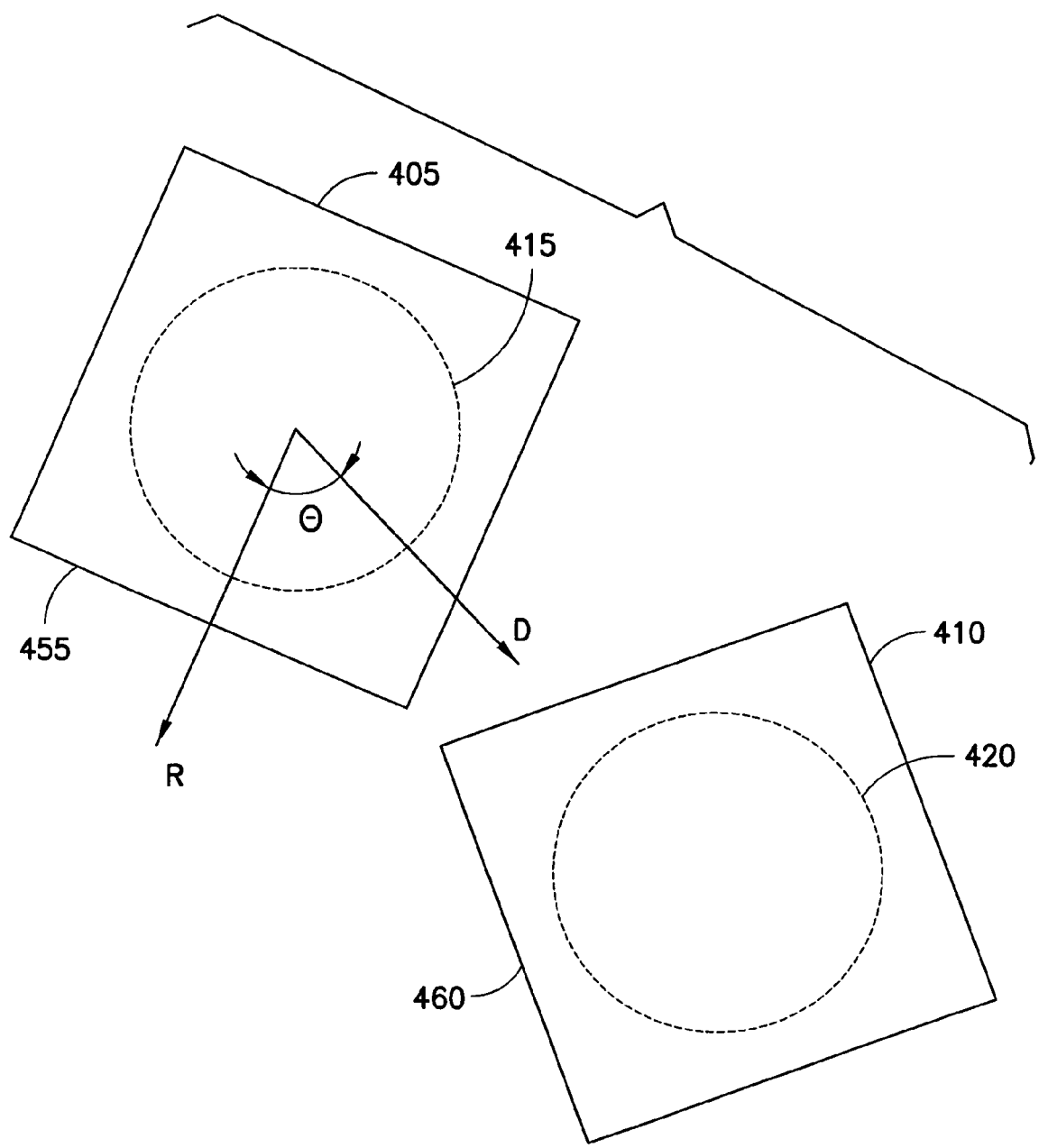
FIG. 15 is a schematic representation illustrating aspects of the exemplary embodiment.

It can also be seen that if a geometric relationship between two substrate stations is known, and the locations of the substrate stations are both known, the control system may determine the angular orientation of the substrate stations in the transport apparatus reference frame. For example, the distance between a first and second substrate station may be known. The angular orientation of the first substrate station relative to the second substrate station may also be known, and may be stored in the control system. If so, the angular orientation of the first substrate station in the transport apparatus reference frame may be determined by the controller upon determining the locations of both substrate stations in the transport apparatus reference frame, and correlating the determined locations to the stored known angular geometry of the first station relative to the second station. The locations of the substrate stations may be individually determined using the substrate aligner according to the technique described above and shown in FIG. 12. This may provide R,θ coordinates of each substrate station, but need not necessarily also provide the angular orientation of the substrate stations. FIG. 15 shows two processing modules 405,410 having respective substrate stations 415,420. The processing modules 405, 410 may each be one of the processing modules 370 shown in FIG. 1 attached to the periphery of the transport chamber 305. Each processing module 405,410 has an access face 455,460. Each access face 455,460 is oriented generally toward the substrate transport apparatus 320. An access in each access face 455,460 is provided for the passage of substrates to and from the respective processing module 405, 410 by the substrate transport apparatus 320. Direction D indicates the direction from the center of substrate station 415 toward the center of substrate station 420. Direction R is a reference direction. For this example, direction R may be the direction from the center of the substrate station through the vertical centerline of access face 450 of the processing module 405. In other embodiments, any other suitable reference direction may be chosen. The angle θ is the angle between direction D and direction R. Angle θ defines the angular geometry of the first substrate station 405 relative to the second substrate station 410. Angle θ may be initially known and stored in the control system. The coordinates of each substrate station 415,420 in the transport apparatus reference frame may be determined using the above described technique. The control system may then apply stored angle θ to determine the angular orientation of substrate station 405 in the transport apparatus reference frame.

Figure 16:
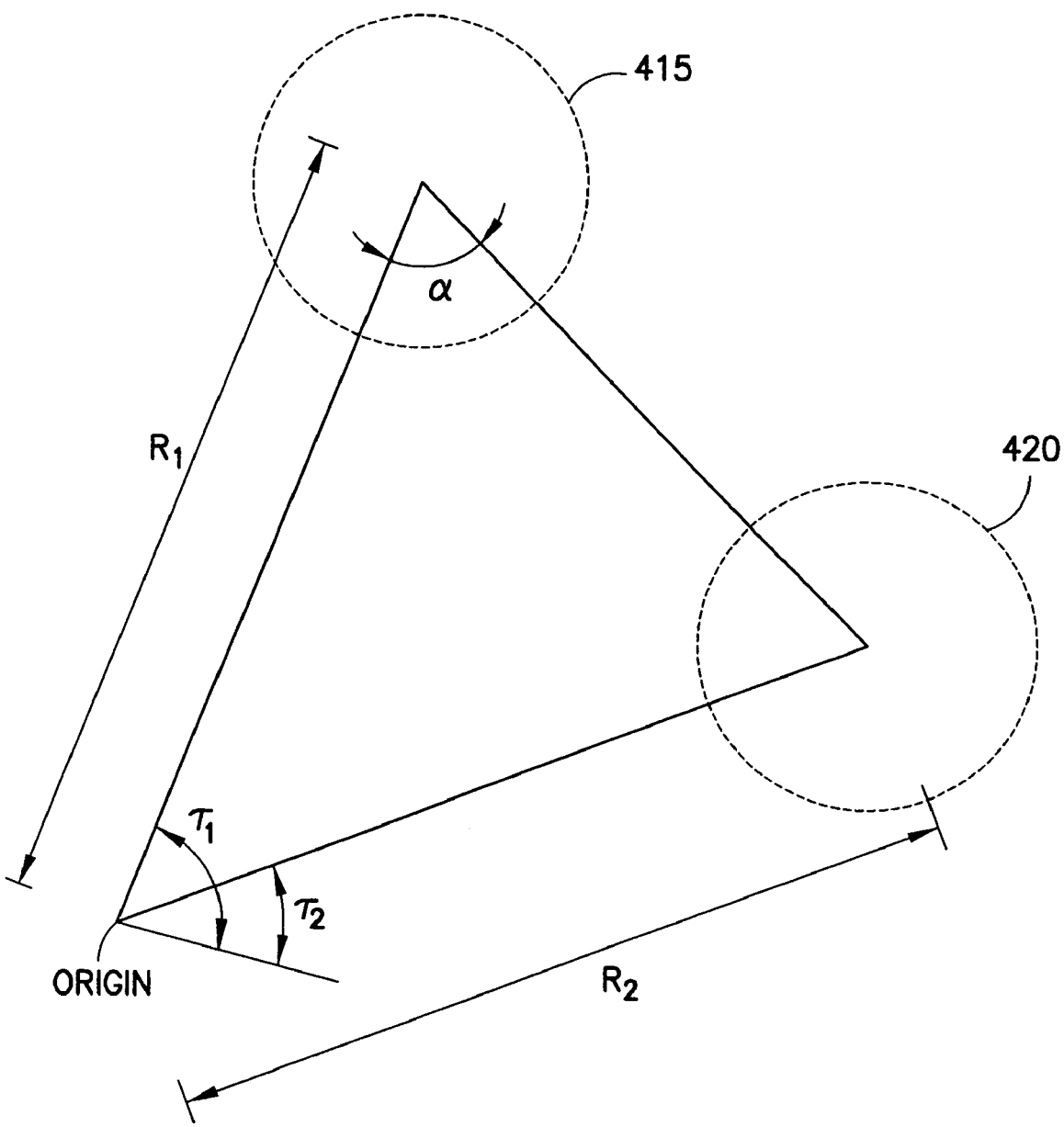
FIG. 16 is another schematic representation illustrating aspects of the exemplary embodiment.

FIG. 16 illustrates geometrically the relationships between the substrate station coordinates and the stored angle θ. The illustration and following equations are by way of example, and alternate geometry as well as alternate mathematical techniques may be used in other embodiments. The transport apparatus coordinate system may be a polar coordinate system with origin at the axis of rotation of the arms 335,340 of the substrate transport apparatus 320. The coordinates of each substrate station 415, 420 may be determined according to the above described technique using the substrate aligner 380, or may be otherwise determined. The coordinates of the center of substrate station 415 may be given as ($R_1$, $T_1$). Similarly, the coordinates of the center of substrate station 420 may be given as ($R_2$, $T_2$). Angle α may be defined as the angle between the origin of the transport apparatus coordinate system and the center of substrate station 420, with vertex at the center of substrate station 415. It can be seen that if angle θ is equal to angle α, access face 455 will be oriented directly toward the axis of rotation of the arms 335,340 of the substrate transport apparatus 320. Applying the known laws of geometry, specifically the law of sines in combination with the law of cosines, gives the following equation for a in terms of the known values $R_1$, $T_1$, $R_2$, and $T_2$.

$$\alpha = \arcsin[(R_2 \sin(T_1-T_2))/\mathrm{sqrt}(R_1^2+R_2^2-2R_1R_2 \cos(T_1-T_2))]$$

Angle α may be calculated by the control system 110 according to the above equation. The control system 110 may compare angle α to stored angle θ to determine the angular orientation of substrate station 405 in the transport apparatus reference frame. The difference between angle α and angle θ gives the angular orientation of substrate station 405 in the transport apparatus reference frame, relative to the origin of the reference frame, which in this example coincides with the axis of rotation of the substrate transport apparatus arms 335,340. In other embodiments of the present invention, other techniques may be used to determine the angular orientation of the substrate station 405. In other embodiments, a different reference frame may be chosen as the transport apparatus reference frame, such as a Cartesian system with an arbitrary origin.

If the exact location of the substrate aligner 380 is unknown, the relationship between the aligner reference system and the transport apparatus reference system may be determined with the following technique. In general terms, the technique involves repeatedly placing the substrate on the aligner 380 with different eccentricities using the transport apparatus 320, recording positional data from both the aligner 380 and the transport apparatus 320, and calculating a solution for the coordinates of the aligner in the transport apparatus coordinate system.

Figure 14:
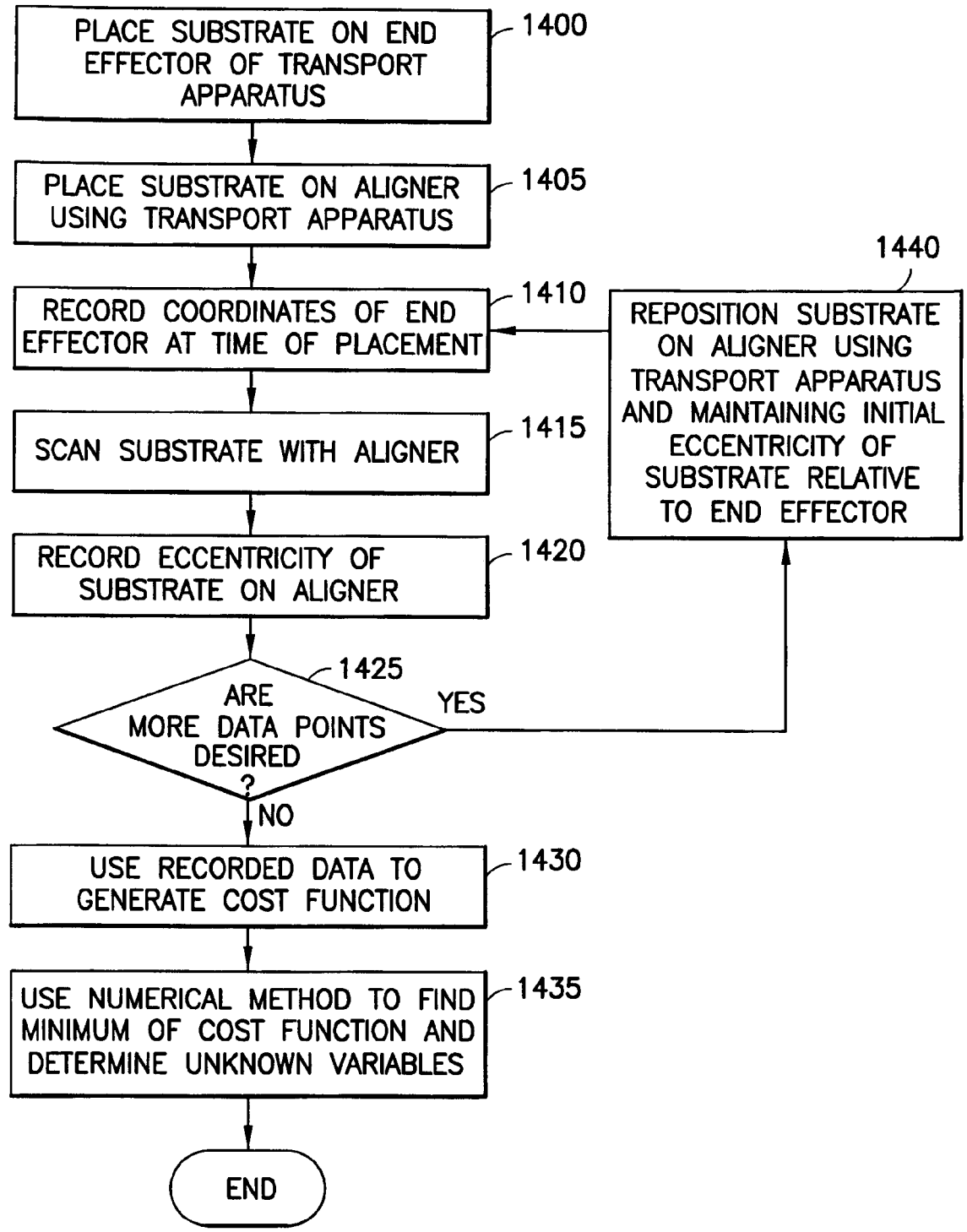
FIG. 14 is another flow chart illustrating aspects of the exemplary embodiment.

As described above, rough coordinates for the location of the aligner 380 may initially be provided to the control system 110. To begin the procedure for determining more accurate coordinates as shown in the flow chart of FIG. 14, a substrate is provided on the end effector 250 in block 1400. The substrate need not be exactly centered, but may have a small eccentricity of about ±5 mm. Therefore this block may be done manually, or a substrate may be picked on to the end effector from one of the load locks 135,140 or processing modules 370. The control system 110 then directs the transport apparatus 320 to place the substrate on the aligner 380 in block 1405. In block 1410, the position of the end effector 365 at the time of placement is recorded by the control system 110. In block 1415, the aligner 380 then scans the substrate to determine eccentricity of the substrate. The measured eccentricity is recorded by the control system 110 in block 1420. Next, the transport apparatus 320 picks the substrate from the aligner 380 maintaining the initial eccentricity of the substrate on the end effector 365. The substrate is again placed on the aligner 380 and scanned, with placement in slightly different location. Another set of data is recorded for this second location, again including eccentricity on the aligner 380 and end effector 365 position. The positions of placement may all be close to each other, such as within about 5 mm apart. The procedure is repeated to generate a third set of data for a third location, still maintaining the initial eccentricity of the substrate on the end effector 365. Additional data points may be collected if desired. Alternate embodiments of the present invention may allow the eccentricity of the substrate on the end effector 365 to vary.

Figure 13:
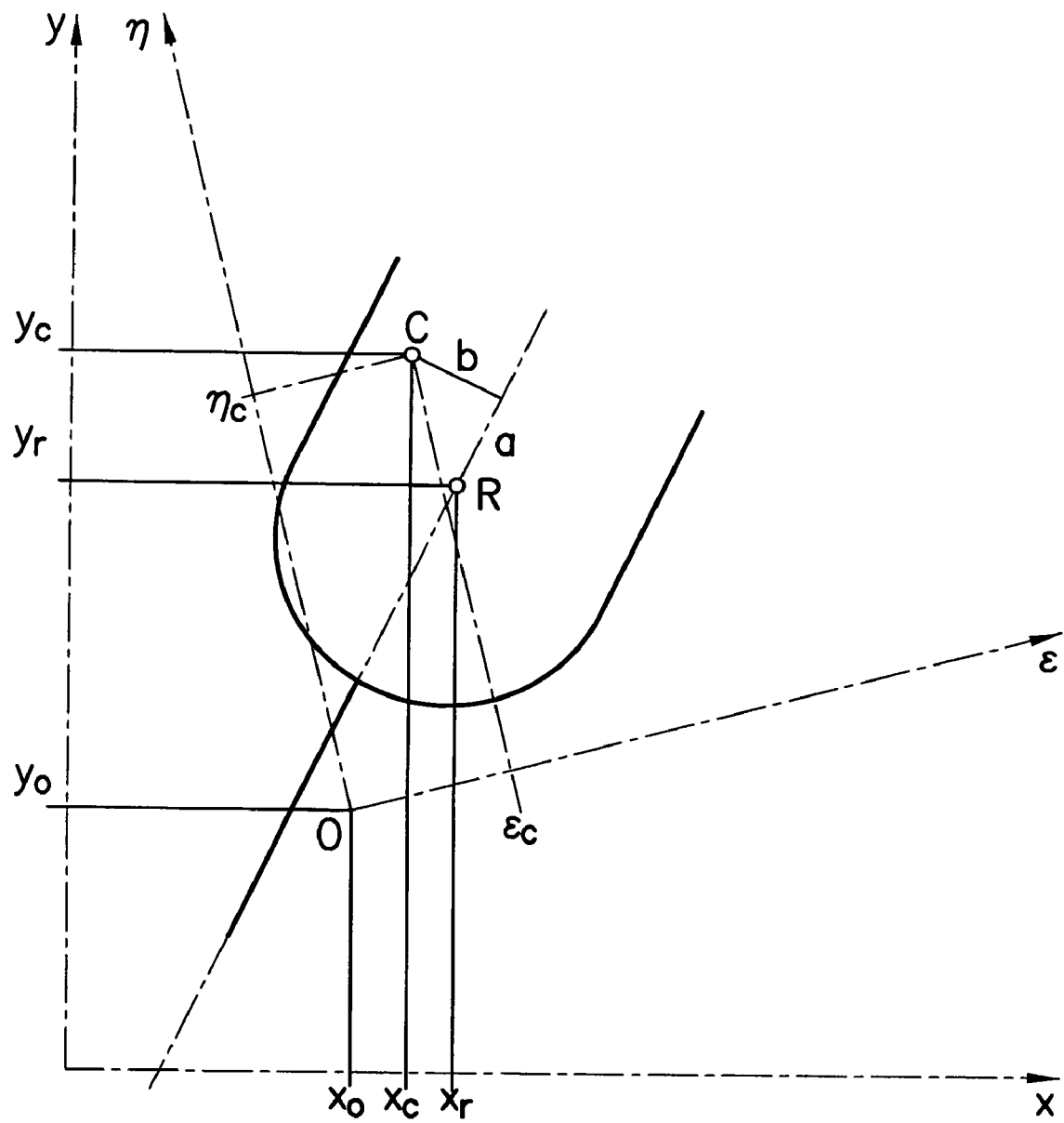
FIG. 13 is another schematic representation illustrating aspects of the exemplary embodiment.

FIG. 13 illustrates the geometric relationship between the aligner reference frame and the substrate transport apparatus reference frame. Positional data for both the aligner 380 and transport apparatus 320 may each be reported to the control system in polar coordinates. However, these coordinate systems are described and shown in FIG. 13 as Cartesian in order to explain the calculations below in a straightforward manner. The control system 110 may also transform the reported polar coordinates into Cartesian coordinates. The Cartesian transport apparatus reference frame has the horizontal components x,y. The Cartesian aligner reference frame has horizontal components ξ,η. The origin of the aligner coordinate system lies at a point $x_0, y_0$ in the transport apparatus coordinate system. The rotation of the aligner coordinate system with respect to the transport apparatus coordinate system, specifically the angle between the x-axis and the ξ-axis, is denoted α. R is a reference point on the end effector 365. A substrate may be considered centered on the end effector 365 when the center of the substrate, indicated by point C, aligns with the reference point R. The eccentricity (or offset) of the substrate center C from reference point R has components a,b. The angular orientation of the end effector in the transport apparatus coordinate system is denoted by θ.

For a given data set, the x-coordinate of substrate center C may be expressed as:

$$x_C = x_R + (a) \cos\theta - (b) \sin\theta$$

and also as:

$$x_C = x_0 + (\xi_C) \cos\alpha - (\eta_C) \sin\alpha$$

Both equations express the same physical length, $x_C$, and therefore it can be seen that ideally both expressions arrive at the same value for $x_C$. However, the relationship between the x,y coordinate system and the ξ,η coordinate system is initially unknown. Also, positional information may have some variance because the measurements have less than perfect precision, even though they may be highly precise. Similar equations may be written for $y_C$. A vector ξ gives the difference between the coordinates of point C using the different expressions. Index i indicates a distinct data point, with $\epsilon_{1i}$ being the x-axis coordinate and $\epsilon_{2i}$ being the y-axis coordinate $$(a)\cos\theta_i - (b)\sin\theta_i - x_0 - (\xi_{Ci})\cos\alpha + (\eta_{Ci})\sin\alpha + x_{Ri} = \epsilon_{1i}$$

and:

$$(a)\sin\theta_i + (b)\cos\theta_i - y_0 - (\xi_{Ci})\sin\alpha - (\eta_{Ci})\cos\alpha + y_{Ri} = \epsilon_{2i}$$

For each distinct data point, $x_{Ri}$, $y_{Ri}$, $\theta_i$, $\xi_{Ci}$ and $\eta_{Ci}$ are known. The unknowns are a, b, $x_0$, $y_0$ and α. A cost function J may be defined to relate the variables, block 1430.

$$J = \sum_{i=1}^{n} (\varepsilon_{1i})^2 + (\varepsilon_{2i})^2$$

In block 1435, the unknown values can be determined by minimizing this cost function using an efficient numerical method. The numerical minimization may be carried out by the control system 110. Ideally, there is a set of values for a, b, $x_0$, $y_0$ and α such that $\epsilon_{1i} = \epsilon_{2i} = 0$ for all i, and therefore J=0. This would imply that the relationship between the aligner coordinate system and the transport apparatus coordinate system had been accurately described by the values for $x_0$, $y_0$ and α. However, as discussed above, positional information may not be measured with perfect precision. Therefore, the minimum value for J may be non-zero.

Determining the minimum of the cost function J gives the values $x_0$, $y_0$ and α describing the relationship between the aligner coordinate system and the substrate transport apparatus coordinate system, and therefore gives accurate coordinates for the aligner 380 in the transport apparatus coordinate system. In addition, values for a, b are found, which describe the eccentricity of the substrate on the end effector 365 relative to point R. All of these values may be used in subsequent operation of the substrate processing apparatus, including using the aligner 380 to determine the locations of substrate stations according to the above described technique. In can also be seen that the above described technique for finding the relationship between the aligner reference system and the transport apparatus reference system may be used to simultaneously find the accurate location of a substrate station. If the substrate is initially picked from a processing module or other device associated with a substrate station, the variables a,b will directly correspond to the offset in the accurate substrate station coordinates from the initial rough coordinates.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
   a frame forming a substrate station surface on which a substrate can be seated; and
   a leveling device connected to the frame for leveling the substrate station surface relative to a predetermined reference frame;
   wherein the leveling device comprises a drive system connected to the frame, a movable arm connected to the drive system and having a movable through-beam sensor thereon, and a control system connected to the drive system for moving the through-beam sensor and positioning the through-beam sensor relative to the substrate station surface; and
   wherein the control system is programmed to position the through-beam sensor for sensing at least one predetermined geometric feature connected to the substrate station surface so that detection of the predetermined geometric feature with the through-beam sensor is capable of defining, in the control system, an inclination of the substrate station surface relative to the reference frame, where the at least one predetermined feature is a feature of the substrate station surface.

2. The apparatus of claim 1, wherein the control system is further programmed to determine a vertical position of the substrate station surface.

3. The apparatus of claim 1 wherein the substrate processing apparatus further comprises a leveling system connected to the frame for changing an orientation of the substrate station surface relative to the predetermined reference frame, and wherein the control system is further programmed to generate a leveling input for adjusting the leveling system to change the orientation of the substrate station surface relative to the predetermined reference frame.

4. The apparatus of claim 3 wherein the leveling input is optimized to minimize the total required adjustment.

5. The apparatus of claim 3 wherein the leveling input is generated to place the substrate station surface at a desired height.

6. The apparatus of claim 1 wherein the control system is further programmed to determine the position of the substrate station along a direction that is perpendicular to a plane within which the movable arm is operable to rotate.

7. The apparatus of claim 1 wherein the leveling device is operable to transport a substrate.

8. An apparatus for determining the inclination of a substrate station relative to a reference plane, the apparatus comprising:
   a drive system;
   a movable arm connected to the drive system and having a positionable through-beam sensor; and a control system controllably connected to the drive system for moving the movable arm and positioning the through-beam sensor at predetermined positions;

wherein the control system is adapted for positioning the through-beam sensor with the drive system to serially approach and detect at least three reference features, the reference features having a predetermined geometrical relationship to the substrate station; and wherein the control system is further adapted to record a position of the sensor when each reference feature is detected; and wherein the control system is programmed to calculate an inclination of the substrate station relative to the reference plane along at least two directions within the reference plane.

9. The apparatus of claim 8, wherein the control system is further programmed to determine the position of the substrate station along a direction that is perpendicular to the reference plane.

10. The apparatus of claim 8 wherein the movable arm comprises at least two rigid members and a joint, the joint being disposed between the two members for rotation of at least one of the two members about a single axis that is perpendicular to the reference plane.

11. The apparatus of claim 10 wherein the control system is further programmed to determine the position of the substrate station along the direction of the single axis.

12. The apparatus of claim 8 wherein the apparatus is operable to transport a substrate.

13. The apparatus of claim 8 wherein the control system is further programmed for determining adjustments to adjustment features for leveling a substrate holder, the substrate holder being adapted to hold a substrate at the substrate station.

14. The apparatus of claim 13 wherein the adjustments are optimized to minimize the total required adjustment.

15. The apparatus of claim 13 wherein the adjustments are also determined so as to place the substrate holder at a desired height.

16. The apparatus of claim 8 wherein the control system is adapted for moving the through-beam sensor, when positioning the through-beam sensor to detect a reference feature, in a predetermined direction having a predetermined orientation relative to the reference plane.

17. The apparatus of claim 16 wherein the predetermined orientation is substantially horizontal.

18. The apparatus of claim 8 wherein the recorded position has a predetermined relationship to the reference plane.

19. A substrate transport apparatus auto-teach system comprising:

a frame forming a substrate station surface on which a substrate can be seated;

a drive system connected to the frame and associated with a transport apparatus coordinate system;

a movable arm connected to the drive system and having a positionable through-beam sensor; and a control system controllably connected to the drive system for moving the movable arm and positioning the through-beam sensor;

wherein the control system is programmed for positioning the through-beam sensor for detecting at least one reference feature connected to the substrate station surface along at least three different substantially co-planar paths of approach, the at least one reference feature having a predetermined geometric relationship to the substrate station surface;

wherein the control system is further programmed to record the position of the sensor when the at least one reference feature is detected on each path of approach, and to determine therefrom the location of the substrate station surface in the transport apparatus coordinate system and an angular orientation of the substrate station surface.

20. The substrate transport apparatus auto-teach system of claim 19 wherein each of the at least three paths of approach is defined by a segment of a different line, and wherein at least three of the lines intersect at a common point.

21. The substrate transport apparatus auto-teach system of claim 19 wherein the control system is programmed to approach one of the reference features along at least two different paths of approach.

22. The substrate transport apparatus auto-teach system of claim 19 wherein the determined angular orientation of the substrate station surface is an angular orientation within a plane defined by the surface.

23. The substrate transport apparatus auto-teach system of claim 19 wherein the paths of approach are each substantially horizontal.

24. The substrate transport apparatus auto-teach system of claim 19 wherein the movable arm is a scara arm.

25. The substrate transport apparatus auto-teach system of claim 19 wherein the substrate station surface is located on or within at least one of a transport container, an aligner, a buffer station, a load lock, a load port, a processing station, or a metrology station.

26. A substrate processing apparatus comprising the substrate transport apparatus auto-teach system of claim 19.

27. A substrate transport apparatus auto-teach system comprising:

a frame defining a substrate station surface capable of supporting a substrate, the substrate station surface having a substantially fixed predetermined location;

a substrate transport apparatus that is movably connected to the frame, the substrate transport apparatus having an associated transport apparatus coordinate system;

an aligner connected to the frame; and a control system operably connected to the substrate transport apparatus and programmed to position with the substrate transport apparatus, an object on the aligner, and to measure with the aligner a spatial relationship between the object on the aligner and the aligner;

wherein the control system is programmed to determine coordinates for the substantially fixed predetermined location of the substrate station surface, in the transport apparatus coordinate system, based on the measured spatial relationship.

28. The system in claim 27, wherein the object has a predetermined positional relationship with respect to the substrate station surface.

29. The system in claim 27, wherein the object is a substrate.

30. The system in claim 27, wherein the control system is further programmed to pick the substrate from the substrate station surface prior to positioning the object on the aligner.

31. The system in claim 30, wherein the control system has a model representation of the substrate station surface locating the substrate station with respect to a reference frame of the model representation.

32. The system of claim 27 wherein the control system is further programmed to determine an angular orientation of the substrate station.

33. A substrate transport apparatus auto-teach system for auto-teaching a location to a substrate transport apparatus, the system comprising:
- a frame, the substrate transport apparatus being movably connected to the frame and having an associated transport apparatus coordinate system;
- a substrate aligner connected to the frame; and
- a control system operably connected to the substrate transport apparatus and to the substrate aligner, the control system being programmed to place, with the substrate transport apparatus, an object on the substrate aligner, and to measure with the substrate aligner a spatial relationship between the placed object on the aligner and the substrate aligner; and
- wherein the control system is programmed to determine coordinates of the substrate aligner in the transport apparatus coordinate system based on the measured spatial relationship.

34. The system in claim 33, wherein the control system determines the coordinates of the substrate aligner by generating a cost function and analyzing the cost function using a numerical method.

35. A method of leveling an object relative to a predetermined reference frame, which comprises:
- approaching and detecting at least one feature at least twice with a through-beam sensor mounted on a robotic arm, the at least one feature having a predetermined geometric relationship to the object, and the object having a substrate support surface capable of supporting a substrate; and
- determining, with a control system connected to the robotic arm, an inclination of the object relative to the predetermined reference frame.

36. The method of claim 35 further comprising generating, with the control system, a leveling input for changing an inclination of the object relative to the predetermined reference frame and leveling the substrate support surface relative to the predetermined reference frame by using the leveling input.

37. The method of claim 35 wherein the robotic arm is a scara arm.

38. The method of claim 35 wherein the at least one feature comprises three features, and wherein each of the three features is approached at least once with the through-beam sensor.

39. A method comprising:
- approaching and detecting at least one reference feature having a predetermined geometric relationship with an object at least three times with a through-beam sensor mounted on a robotic arm, the robotic arm being controlled by a control system; and
- determining, with the control system, a location of the object in at least two degrees of freedom relative to a predetermined reference frame, and determining an angular orientation of the object, the location and angular orientation being determined from the detection of the reference features.

40. The method of claim 39 wherein the at least one reference feature comprises at least two reference features.

41. The method of claim 39 wherein the object comprises a substrate support for removably supporting a substrate.

42. The method of claim 39 wherein the robotic arm is a scara arm.

43. A method of determining a location of a substrate aligner relative to a predetermined reference frame, which comprises:
- providing a control system;
- providing a substrate transport apparatus communicably connected to the control system;
- providing a substrate aligner communicably connected to the control system;
- placing an object on the substrate aligner with the substrate transport apparatus, and generating from the placed object positional data relating a substrate aligner location to one or more locations of the placed object on the substrate aligner; and
- analyzing the positional data with the control system to determine the location of the substrate aligner relative to a predetermined reference frame.

44. The method of claim 43 wherein the object is placed on the substrate aligner more than once, and wherein no pair of the locations of placement of the object are located more than about five millimeters apart.

45. The method of claim 43 wherein analyzing the positional data comprises generating a cost function with the control system and using the control system to find an extreme of the cost function with a numerical technique.

* * * * *